US012300325B2

(12) United States Patent
Kang et al.

(10) Patent No.: US 12,300,325 B2
(45) Date of Patent: May 13, 2025

(54) NON-VOLATILE MEMORY DEVICE DETERMINING READ RECLAIM, METHOD OF OPERATING THE SAME, AND METHOD OF OPERATING STORAGE DEVICE INCLUDING THE SAME

(71) Applicant: Samsung Electronics Co., Ltd., Suwon-si (KR)

(72) Inventors: Woohyun Kang, Suwon-si (KR); Jin-Young Kim, Suwon-si (KR); Hyuna Kim, Suwon-si (KR); Se Hwan Park, Suwon-si (KR); Youngdeok Seo, Suwon-si (KR); Hyunkyo Oh, Suwon-si (KR); Heewon Lee, Suwon-si (KR); Donghoo Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 173 days.

(21) Appl. No.: 18/170,893

(22) Filed: Feb. 17, 2023

(65) Prior Publication Data

US 2024/0046993 A1 Feb. 8, 2024

(30) Foreign Application Priority Data

Aug. 4, 2022 (KR) ........................ 10-2022-0097196

(51) Int. Cl.
*G11C 16/12* (2006.01)
*G06F 11/10* (2006.01)
*G11C 16/26* (2006.01)

(52) U.S. Cl.
CPC .......... *G11C 16/12* (2013.01); *G06F 11/1044* (2013.01); *G11C 16/26* (2013.01)

(58) Field of Classification Search
CPC .......... G11C 16/12; G11C 16/26; G11C 7/04; G11C 11/5642; G11C 16/3418; G11C 16/3495; G11C 29/021; G11C 29/028; G06F 11/1044; G06F 11/1048; G06F 12/0238; G06F 12/0253
See application file for complete search history.

(56) References Cited

U.S. PATENT DOCUMENTS

| 9,519,576 | B2 | 12/2016 | Seo et al. |
| 9,524,208 | B2 | 12/2016 | Kim et al. |
| 9,535,620 | B2 | 1/2017 | Kim et al. |
| 9,690,654 | B2 | 6/2017 | No et al. |

(Continued)

FOREIGN PATENT DOCUMENTS

| KR | 1020150140496 A | 12/2015 |
| KR | 1020180058890 A | 6/2018 |

(Continued)

*Primary Examiner* — Xiaochun L Chen
(74) *Attorney, Agent, or Firm* — Myers Bigel, P.A.

(57) ABSTRACT

A method of operating a non-volatile memory device, which is configured to communicate with a storage controller includes: receiving a first request indicating a read reclaim determination and including environment information from the storage controller, performing a first on-chip read operation for generating first distribution information based on the first request, determining whether a read reclaim is required based on the first distribution information, and providing the storage controller with a determination result having a first bit value in response to determining that the read reclaim is required.

17 Claims, 18 Drawing Sheets

(56) References Cited

U.S. PATENT DOCUMENTS

| | | | |
|---|---|---|---|
| 9,852,802 B2 | 12/2017 | Yoo | |
| 9,965,202 B2 | 5/2018 | Kogita et al. | |
| 10,340,947 B2 | 7/2019 | Oh et al. | |
| 10,509,720 B2 * | 12/2019 | Kim | ............... G06F 12/0215 |
| 11,099,745 B2 | 8/2021 | Lee et al. | |
| 2010/0235713 A1 | 9/2010 | Lee et al. | |
| 2015/0355845 A1 | 12/2015 | Lee et al. | |
| 2016/0351235 A1 * | 12/2016 | Chae | ............... G11C 7/20 |
| 2018/0143762 A1 | 5/2018 | Kim et al. | |
| 2019/0146688 A1 | 5/2019 | Oh et al. | |
| 2020/0042245 A1 | 2/2020 | Lee et al. | |
| 2021/0265004 A1 | 8/2021 | You | |
| 2022/0066870 A1 | 3/2022 | Choi et al. | |
| 2022/0139475 A1 | 5/2022 | Seo et al. | |
| 2022/0157381 A1 | 5/2022 | Kim et al. | |
| 2022/0172785 A1 | 6/2022 | Yoo et al. | |
| 2022/0180957 A1 | 6/2022 | Yang et al. | |
| 2022/0269438 A1 * | 8/2022 | Golov | ............... G11C 16/26 |

FOREIGN PATENT DOCUMENTS

| | | |
|---|---|---|
| KR | 1020190054239 A | 5/2019 |
| KR | 102025193 B1 | 9/2019 |
| KR | 102110767 B1 | 6/2020 |
| KR | 102250423 B1 | 5/2021 |
| KR | 102387956 B1 | 4/2022 |
| KR | 1020220058278 A | 5/2022 |
| KR | 1020220067419 A | 5/2022 |
| KR | 1020220080790 A | 6/2022 |

* cited by examiner

FIG. 15

| | Determination Result (DR) | Default Read Condition | | History Read Condition | |
|---|---|---|---|---|---|
| <Case 1> Default Read Without Tmperature Information | 1 (Read Reclaim is Required) | x + y > A | - | - | - |
| | 1 (Read Reclaim is Required) | - | (x or y) > B | - | - |
| | 0 (Read Reclaim is not Required) | x + y ≤ A | (x or y) ≤ B | - | - |
| <Case 2> History Read Without Tmperature Information | 1 (Read Reclaim is Required) | - | - | x + y > C | - |
| | 1 (Read Reclaim is Required) | - | - | - | (x or y) > D |
| | 0 (Read Reclaim is not Required) | - | - | x + y ≤ C | (x or y) ≤ D |
| <Case 3> Default Read With Tmperature Information | 1 (Read Reclaim is Required) | x + y > At | - | - | - |
| | 1 (Read Reclaim is Required) | - | (x or y) > Bt | - | - |
| | 0 (Read Reclaim is not Required) | x + y ≤ At | (x or y) ≤ Bt | - | - |
| <Case 4> History Read With Tmperature Information | 1 (Read Reclaim is Required) | - | - | x + y > Ct | - |
| | 1 (Read Reclaim is Required) | - | - | - | (x or y) > Dt |
| | 0 (Read Reclaim is not Required) | - | - | x + y ≤ Ct | (x or y) ≤ Dt |

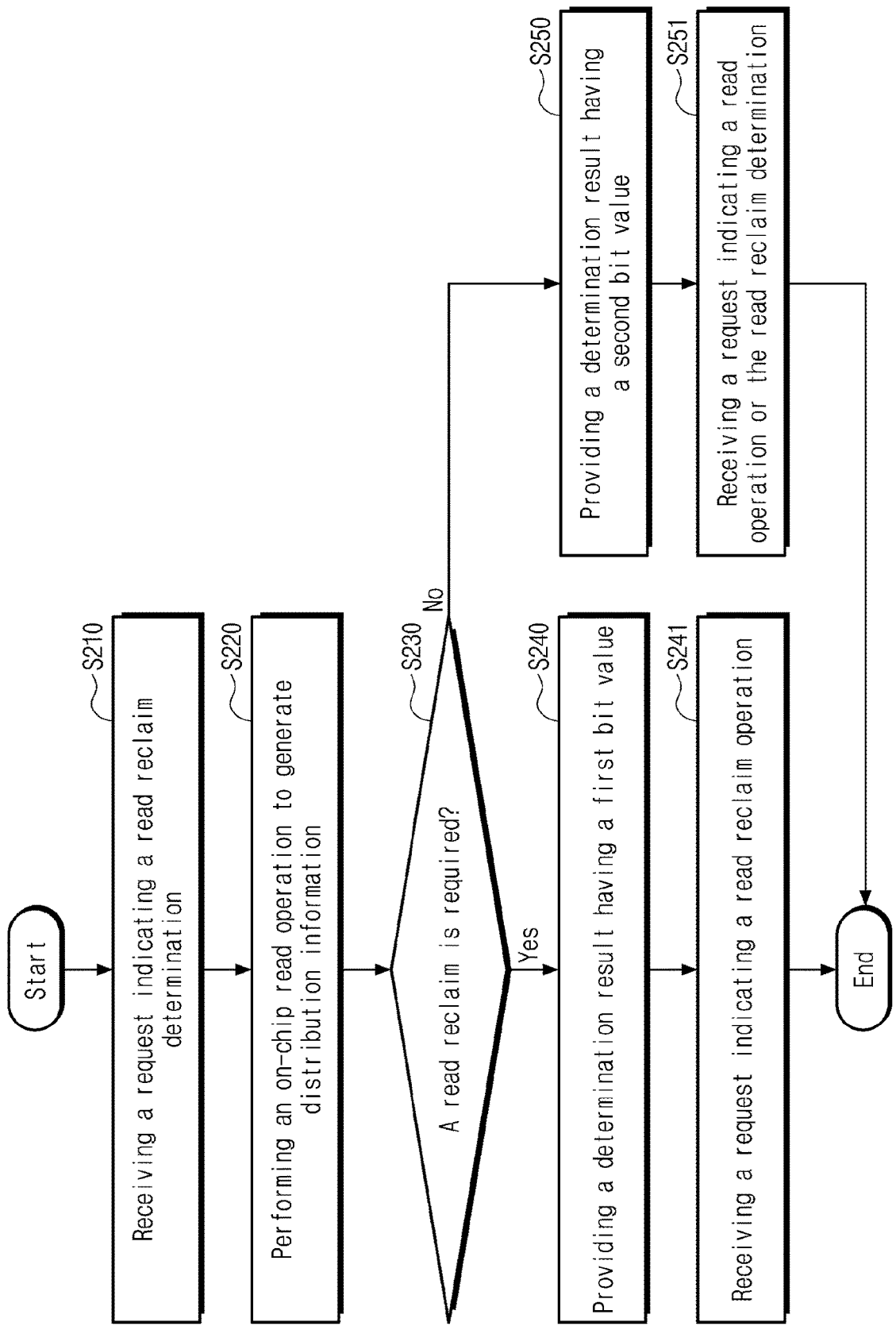

NON-VOLATILE MEMORY DEVICE DETERMINING READ RECLAIM, METHOD OF OPERATING THE SAME, AND METHOD OF OPERATING STORAGE DEVICE INCLUDING THE SAME

CROSS-REFERENCE TO RELATED APPLICATIONS

This application claims priority under 35 U.S.C. § 119 to Korean Patent Application No. 10-2022-0097196 filed on Aug. 4, 2022, in the Korean Intellectual Property Office, the disclosures of which are incorporated by reference herein in their entireties.

BACKGROUND

Embodiments of the present disclosure described herein relate to a non-volatile memory device, and more particularly, relate to a non-volatile memory device configured to determine whether a read reclaim is required, a method of operating the same, and a method of operating a storage device including the same.

A memory device stores data in response to a write request and outputs data stored therein in response to a read request. For example, a memory device may be classified as a volatile memory device, which loses data stored therein when a power supply is interrupted, such as a dynamic random access memory (DRAM) device, a static RAM (SRAM) device, or a non-volatile memory device, which retains data stored therein even when a power supply is interrupted, such as a flash memory device, a phase-change RAM (PRAM), a magnetic RAM (MRAM), or a resistive RAM (RRAM).

A memory cell of a non-volatile memory device may have a programmed threshold voltage distribution corresponding to a bit value of data. A threshold voltage distribution may change due to various factors, such as retention, read disturb, and hot-carrier injection (HCI). The change in the threshold voltage distribution may cause a reduction of reliability of the non-volatile memory device. To maintain the reliability of the non-volatile memory device, a read reclaim may be required when the variation of the threshold voltage distribution exceeds a threshold value.

SUMMARY

Embodiments of the present disclosure provide a non-volatile memory device configured to determine whether a read reclaim is required, a method of operating the same, and a method of operating a storage device including the same.

According to an embodiment, a method of operating a non-volatile memory device, which communicates with a storage controller, includes receiving a first request indicating a read reclaim determination and including environment information from the storage controller, performing a first on-chip read operation for generating first distribution information based on the first request, determining whether a read reclaim is required based on the first distribution information, and providing the storage controller with a determination result having a first bit value in response to determining that the read reclaim is required.

According to an embodiment, a method of operating a storage device, which includes a non-volatile memory device and a storage controller includes providing, by the storage controller, a first request indicating a read reclaim determination and including environment information to the non-volatile memory device, performing, by the non-volatile memory device, an on-chip read operation for generating distribution information based on the first request, determining, by the non-volatile memory device, whether a read reclaim is required based on the distribution information, providing, by the non-volatile memory device, the storage controller with a determination result having a first bit value in response to determining that the read reclaim is required, providing, by the storage controller, the non-volatile memory device with a second request indicating a read reclaim operation based on the determination result having the first bit value, and performing, by the non-volatile memory device, the read reclaim operation based on the second request.

According to an embodiment, a non-volatile memory device includes a memory cell array that stores target data, and control logic that manages the target data based on communication with a storage controller. The control logic receives a request indicating a read reclaim determination and including environment information from the storage controller, performs an on-chip read operation of the target data for generating distribution information based on the request, determines whether a read reclaim for the target data is required based on the distribution information, provides the storage controller with a determination result having a first bit value in response to determining that the read reclaim is required, and provides the storage controller with the determination result having a second bit value, different from the first bit value, in response to determining that the read reclaim is not required.

BRIEF DESCRIPTION OF THE FIGURES

The above and other objects and features of the present disclosure will become apparent by describing in detail embodiments thereof with reference to the accompanying drawings.

FIG. 15 is a diagram illustrating a method of determining read reclaim, according to some embodiments of the present disclosure.

FIG. 16 is a flowchart illustrating a method of operating a non-volatile memory device, according to some embodiments of the present disclosure.

DETAILED DESCRIPTION

Figure 1:
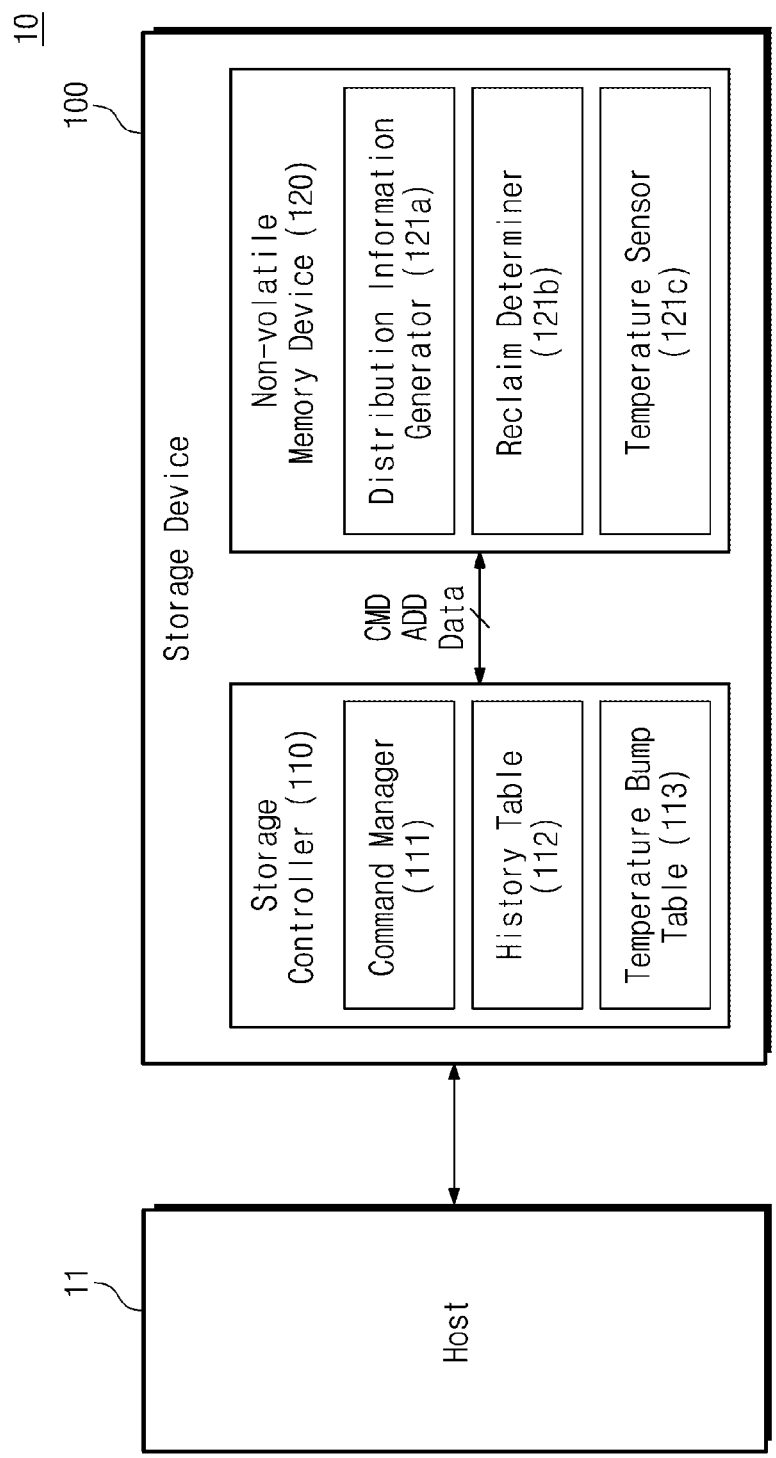
FIG. 1 is a block diagram of a storage system, according to some embodiments of the present disclosure.

Hereinafter, example embodiments of the present disclosure will be described with reference to the accompanying drawings. The present disclosure may, however, be embodied in many different forms and should not be construed as limited to the embodiments set forth herein. Like reference numerals refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a storage system according to some embodiments of the present disclosure. Referring to FIG. 1, a storage system 10 may include a host 11 and a storage device 100. In some embodiments, the storage system 10 may be a computing system, which is configured to process a variety of information, such as a personal computer (PC), a notebook, a laptop, a server, a workstation, a tablet PC, a smartphone, a digital camera, and a black box.

The host 11 may be configured to control an overall operation of the storage system 10. For example, the host 11 may store data in the storage device 100 or may read data stored in the storage device 100.

The storage device 100 may include a storage controller 110 and a non-volatile memory device 120. The non-volatile memory device 120 may be configured to store data. The storage controller 110 may be configured to store data in the non-volatile memory device 120 or may be configured to read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

In some embodiments, the non-volatile memory device 120 may be a NAND flash memory device, but embodiments of the present disclosure are not limited thereto. For example, the non-volatile memory device 120 may be one of various storage devices, which retain data stored therein even though a power is turned off, such as a phase-change random access memory (PRAM), a magnetic random access memory (MRAM), a resistive random access memory (RRAM), and a ferroelectric random access memory (FRAM).

The storage controller 110 may include a command manager 111, a history table 112, and a temperature bump table 113.

The command manager 111 may be configured to manage various commands indicating operations to be performed in the non-volatile memory device 120. For example, the command manager 111 may be configured to provide the non-volatile memory device 120 with various commands, such as a read command, a write command, an erase command, and a read reclaim command.

The read reclaim operation may refer to a rewrite operation for guaranteeing or maintaining the reliability of data. For example, a memory cell may have a programmed threshold voltage distribution corresponding to a bit value of data. A threshold voltage distribution may change due to various factors, such as retention, read disturb, and hot-carrier injection (HCI). The change in the threshold voltage distribution may cause the reduction of reliability of the non-volatile memory device. When the variation of the threshold voltage distribution of a degraded memory region (e.g., a memory block, a sub-memory block, or a memory chip) exceeds a threshold value, the storage device 100 may copy data of the degraded memory region to any other memory region and may then erase the data of the degraded memory region.

According to embodiments of the present disclosure, the command manager 111 may be configured to provide the non-volatile memory device 120 with a command indicating read reclaim determination. The command indicating the read reclaim determination may be implemented by changing the read command, and may be a command defined in the present disclosure.

In general, whether the read reclaim is required may be determined by a storage controller. That the storage controller receives distribution information indicating a degradation level (e.g., the variation of the threshold voltage distribution of memory cells) from the non-volatile memory device may cause the increase of the latency and the input/output (I/O) load between the storage controller and the non-volatile memory device.

In contrast, according to embodiments of the present disclosure, the command manager 111 of the storage controller 110 may provide the non-volatile memory device 120 with the command indicating the read reclaim determination. The non-volatile memory device 120 may be configured to determine whether the read reclaim is required. The command manager 111 may receive a determination result from the non-volatile memory device 120. The command manager 111 may issue the read reclaim command based on the determination result. That is, the storage device 100 may be configured to support an on-chip operation of the read reclaim determination. As such, the latency and the I/O load between the storage controller 110 and the non-volatile memory device 120 may be reduced.

The history table 112 may be used to manage offset information of the memory cells of the non-volatile memory device 120. For example, the command manager 111 may be configured to provide the non-volatile memory device 120 with the read command indicating the on-chip read operation. The on-chip read operation may refer to an operation where read data and the distribution information are generated by the non-volatile memory device 120.

For example, the on-chip read operation may include an on-chip valley search operation or may include a valley search operation using a super-high performance (SHP)-LRE manner. The SHP-LRE manner may refer to a manner of searching for the optimized valley by using the count values obtained in the on-chip read operation.

The command manager 111 may receive the distribution information from the non-volatile memory device 120. The command manager 111 may update the offset information of the history table 112 based on the distribution information.

The offset information may indicate a difference between a voltage level of the optimized valley at a time when the read command for obtaining the distribution information is processed and a voltage level of a default valley at an initial time (i.e., at a time when a bit value is programmed). The offset information may be used in the following read operation or may be used to request the read reclaim determination from the non-volatile memory device 120. The offset information may contribute to improving the accuracy of the read reclaim determination.

The temperature bump table 113 may be configured to manage temperature information. The temperature information may be also referred to as "temperature bump information." The temperature information may indicate write temperature information when data are stored in the non-volatile memory device 120. For example, the command manager 111 may be configured to provide the non-volatile memory device 120 with the write command indicating the write operation. The non-volatile memory device 120 may be configured to generate the temperature information by sensing a temperature of the non-volatile memory device 120 while performing the write operation. The non-volatile memory device 120 may be configured to provide the storage controller 110 with the temperature information corresponding to the write operation. The history table 112 may be configured to store the temperature information under control of the command manager 111.

The non-volatile memory device 120 may include a distribution information generator 121a, a reclaim determiner 121b, and a temperature sensor 121c.

The distribution information generator 121a may be configured to generate the distribution information of the read data corresponding to the on-chip read operation. For example, the non-volatile memory device 120 may be configured to perform the on-chip read operation based on the read command or the command indicating the read reclaim determination. In the on-chip read operation, the distribution information generator 121a may be configured to generate the distribution information as the byproduct of the read data in the process of obtaining the read data.

When the non-volatile memory device 120 processes the read command, the distribution information generator 121a may be configured to provide the storage controller 110 with the distribution information. When the non-volatile memory device 120 processes the command indicating the read reclaim determination, the distribution information generator 121a may be configured to provide the distribution information to the reclaim determiner 121b.

The reclaim determiner 121b may be configured to determine whether the read reclaim is required based on the distribution information. The reclaim determiner 121b may be configured to provide the storage controller 110 with a result of determining whether the read reclaim is required.

For example, in response to determining that the read reclaim is required, the reclaim determiner 121b may be configured to provide the storage controller 110 with the determination result having a first bit value (e.g., bit "1"). In response to determining that the read reclaim is not required, the reclaim determiner 121b may be configured to provide the storage controller 110 with the determination result having a second bit value (e.g., bit "0").

The temperature sensor 121c may be configured to sense the temperature of the non-volatile memory device 120 and may generate the temperature information.

The temperature information that the temperature sensor 121c senses while the write command is processed may be referred to as "write temperature information." For example, the non-volatile memory device 120 may be configured to receive the write command from the storage controller 110. While the non-volatile memory device 120 processes the write command, the temperature sensor 121c may be configured to generate the write temperature information corresponding to the write operation. The temperature sensor 121c may be configured to provide the write temperature information to the storage controller 110. The write temperature information may be stored in the temperature bump table 113.

The temperature information that the temperature sensor 121c generates while the command indicating the read reclaim determination is processed may be referred to as "read temperature information." For example, the non-volatile memory device 120 may receive the write temperature information and the command indicating the read reclaim determination from the storage controller 110. The temperature sensor 121c may be configured to generate the read temperature information. The temperature sensor 121c may be configured to provide the read temperature information to the reclaim determiner 121b. The reclaim determiner 121b may be configured to determine whether the read reclaim is required based on the write temperature information received from the temperature bump table 113 and the read temperature information received from the temperature sensor 121c. The write temperature information and the read temperature information may contribute to improving the accuracy of the read temperature information.

Figure 2:
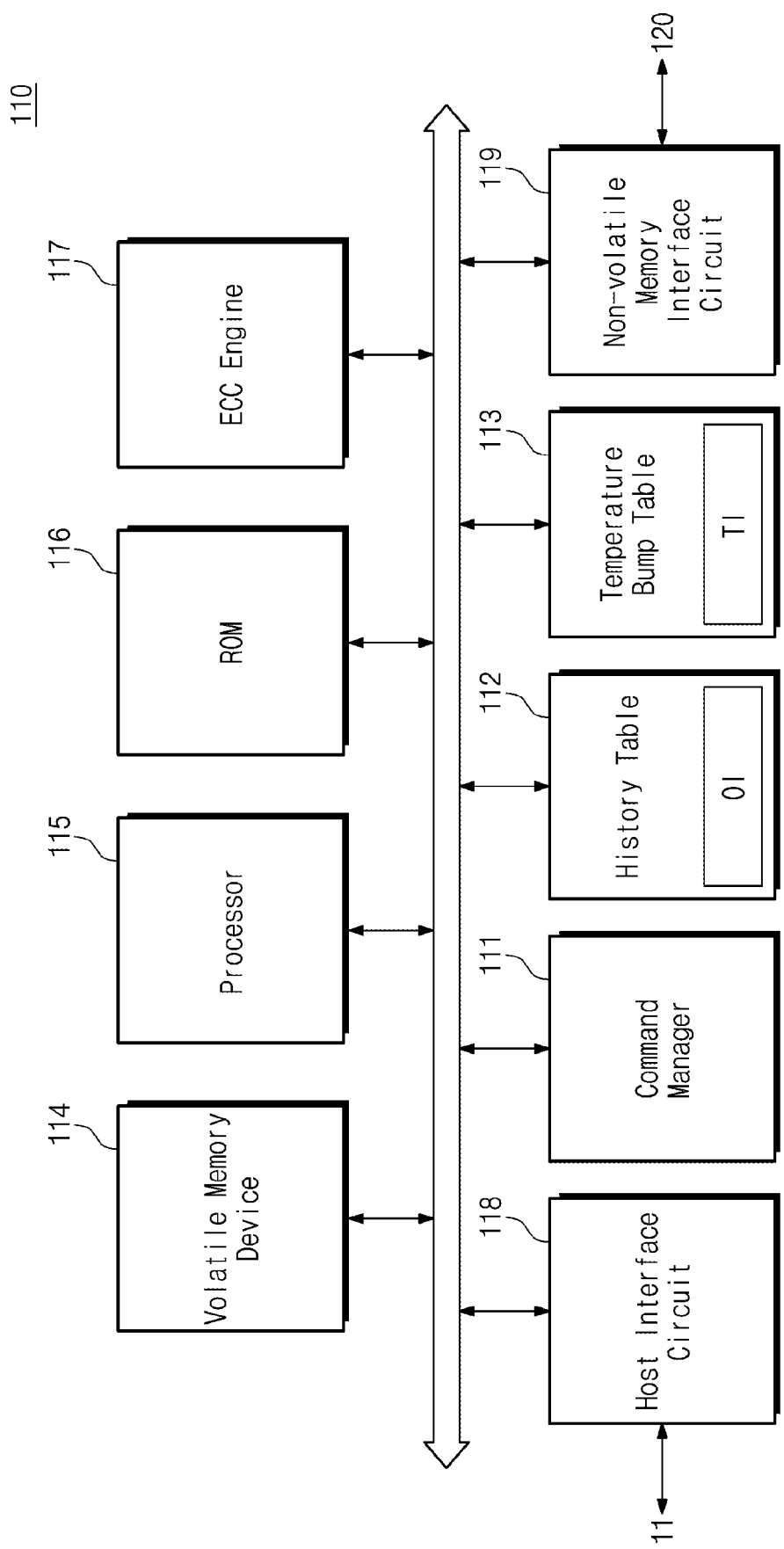
FIG. 2 is a block diagram illustrating a storage controller of FIG. 1 in detail, according to some embodiments of the present disclosure.

FIG. 2 is a block diagram illustrating a storage controller of FIG. 1 in detail, according to some embodiments of the present disclosure. Referring to FIGS. 1 and 2, the storage controller 110 may be configured to communicate with the host 11 and the non-volatile memory device 120.

The storage controller 110 may include the command manager 111, the history table 112, the temperature bump table 113, a volatile memory device 114, a processor 115, a read only memory (ROM) 116, an error correcting code (ECC) engine 117, a host interface circuit 118, and a non-volatile memory interface circuit 119. The command manager 111, the history table 112, and the temperature bump table 113 may correspond to the command manager 111, the history table 112, and the temperature bump table 113 of FIG. 1.

The command manager 111 may be configured to generate commands indicating various operations to be performed in the non-volatile memory device 120.

The history table 112 may be configured to store offset information OI. For example, the command manager 111 may be configured to provide the non-volatile memory device 120 with the read command indicating the on-chip read operation. The non-volatile memory device 120 may be configured to provide the storage controller 110 with the read data and the distribution information as a response to the read command. The command manager 111 may be configured to update the offset information OI of the history table 112 based on the distribution information. That is, the history table 112 may be configured to store the offset information OI corresponding to the distribution information generated based on the finally processed read command.

The temperature bump table 113 may be configured to store temperature information TI. For example, the command manager 111 may be configured to provide the write command or the read reclaim command to the non-volatile memory device 120. While processing the write command or performing the rewrite operation on a new memory region based on the read reclaim command, the non-volatile memory device 120 may be configured to generate the temperature information TI. The non-volatile memory device 120 may be configured to provide the temperature information TI to the storage controller 110. The temperature bump table 113 may be configured to store the temperature information TI under control of the command manager 111. The temperature information TI may be also referred to as "write temperature information."

In some embodiments, the command manager 111, the history table 112, and the temperature bump table 113 may be implemented with a firmware (or other form of computer readable program code) module. For example, the processor 115 may be configured to implement the command manager 111, the history table 112, and the temperature bump table 113 by loading instructions stored in the non-volatile memory device 120 to the volatile memory device 114 and executing the loaded instructions. However, embodiments of the present disclosure are not limited thereto. For example, the command manager 111, the history table 112, and the temperature bump table 113 may be implemented with separate hardware or may be implemented with a combination of hardware and software.

The volatile memory device 114 may be used as a main memory, a buffer memory, or a cache memory of the storage controller 110. The processor 115 may be configured to control an overall operation of the storage controller 110. The ROM 116 may be used as a read only memory that stores information necessary for the operation of the storage controller 110.

The ECC engine 117 may be configured to detect and correct an error of data obtained from the non-volatile memory device 120. For example, the ECC engine 117 may have an error correction capability of a given level. When an error level (e.g., the number of flipped bits) of data exceeds the error correction capability, the ECC engine 117 may be configured to determine that the data have an uncorrectable error.

The storage controller 110 may be configured to communicate with the host 11 through the host interface circuit 118. In some embodiments, the host interface circuit 118 may be implemented based one or more various interfaces, such as a serial ATA (SATA) interface, a peripheral component interconnect express (PCIe) interface, a serial attached SCSI (SAS), a nonvolatile memory express (NVMe) interface, and a universal flash storage (UFS) interface.

The storage controller 110 may communicate with the non-volatile memory device 120 through the non-volatile memory interface circuit 119. In some embodiments, the non-volatile memory interface circuit 119 may be implemented based on a NAND interface.

Figure 3:
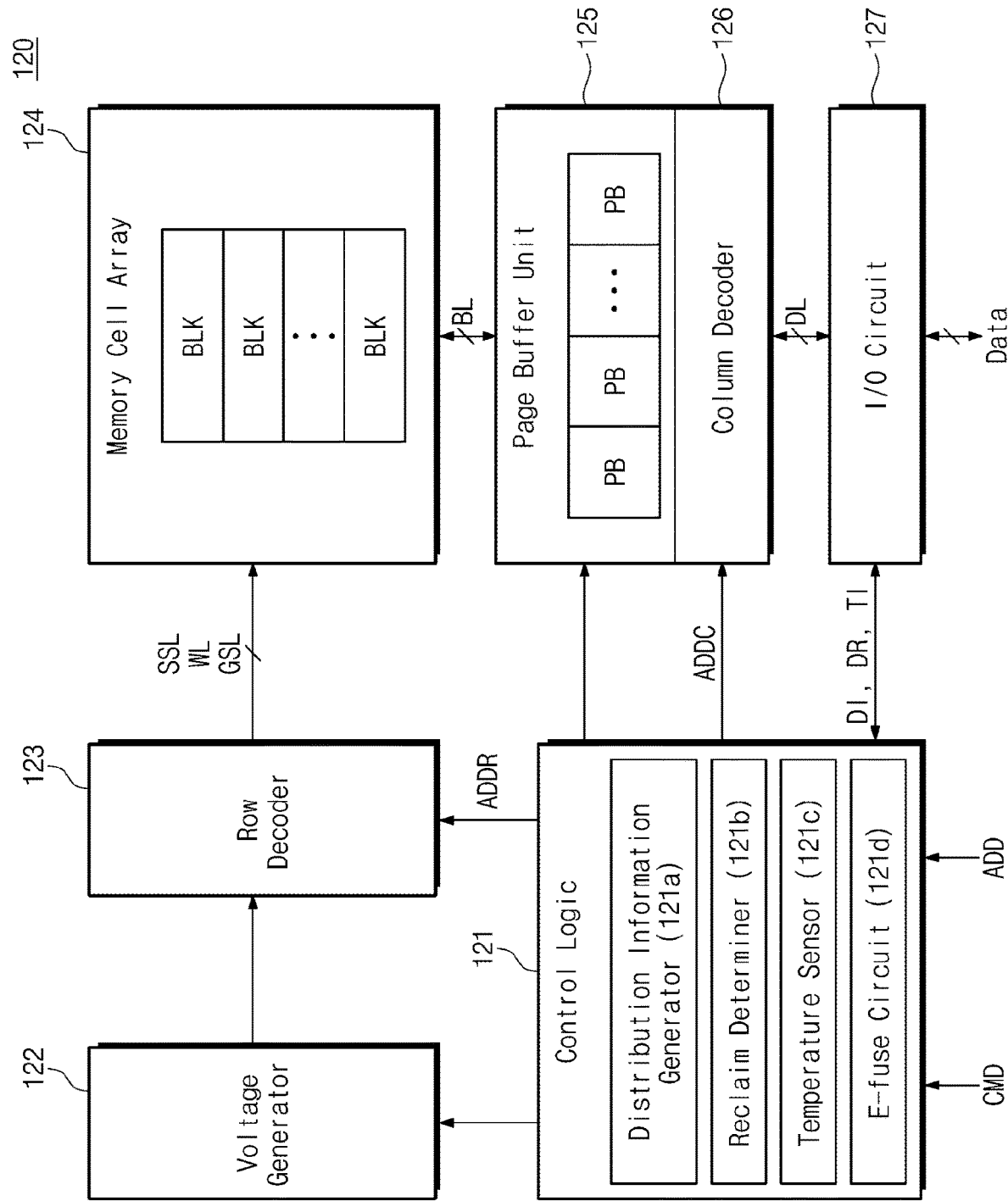
FIG. 3 is a block diagram illustrating a non-volatile memory device of FIG. 1 in detail, according to some embodiments of the present disclosure.

FIG. 3 is a block diagram illustrating a non-volatile memory device of FIG. 1 in detail, according to some embodiments of the present disclosure. Referring to FIGS. 1 and 3, the non-volatile memory device 120 may be configured to communicate with the storage controller 110. For example, the non-volatile memory device 120 may be configured to receive an address ADD and a command CMD from the storage controller 110. The non-volatile memory device 120 may exchange data with the storage controller 110.

The non-volatile memory device 120 may include control logic 121, a voltage generator 122, a row decoder 123, a memory cell array 124, a page buffer unit 125, a column decoder 126, and an input/output (I/O) circuit 127.

The control logic 121 may be configured to receive the command CMD and the address ADD from the storage controller 110. The command CMD may refer to a signal indicating an operation to be performed by the non-volatile memory device 120, such as a read operation, a write operation, an erase operation, or a read reclaim operation. The address ADD may include a row address ADDR and a column address ADDC. The control logic 121 may be configured to control an overall operation of the non-volatile memory device 120 based on the command CMD and the address ADD. The control logic 121 may be configured to generate the row address ADDR and the column address ADDC based on the address ADD.

The control logic 121 may include the distribution information generator 121a, the reclaim determiner 121b, the temperature sensor 121c, and an E-fuse circuit 121d.

While the non-volatile memory device 120 performs the on-chip read operation, the distribution information generator 121a may be configured to generate distribution information DI based on the communication with the I/O circuit 127. The distribution information generator 121a may be configured to store the distribution information DI in the E-fuse circuit 121d or may store offset information in the E-fuse circuit 121d based on the distribution information DI. The distribution information generator 121a may be configured to provide the distribution information DI to the storage controller 110 through the I/O circuit 127.

While processing the command indicating the read reclaim determination, the distribution information generator 121a may be configured to generate the distribution information DI based on the communication with the I/O circuit 127. The distribution information generator 121a may be configured to provide the distribution information DI to the reclaim determiner 121b. The reclaim determiner 121b may be configured to determine whether the read reclaim is required, based on the distribution information DI.

The reclaim determiner 121b may be configured to receive the distribution information DI from the distribution information generator 121a. The reclaim determiner 121b may be configured to determine whether the read reclaim is required based on the distribution information DI. Depending on whether the read reclaim is required, the reclaim determiner 121b may be configured to generate a determination result DR having the first bit value or the second bit value. The reclaim determiner 121b may be configured to provide the determination result DR to the storage controller 110 through the I/O circuit 127.

In some embodiments, the reclaim determiner 121b may be configured to determine whether the read reclaim is required based on the distribution information DI and the temperature information TI generated by the temperature sensor 121c.

In some embodiments, the reclaim determiner 121b may be configured to determine whether the read reclaim is required based on the distribution information DI and parameter values stored in the E-fuse circuit 121d.

The temperature sensor 121c may be configured to sense the temperature of the non-volatile memory device 120 and may be configured to generate the temperature information TI.

In some embodiments, the temperature sensor 121c may be configured to generate the write temperature information. For example, when the command indicating the write operation or the read reclaim operation is received from the storage controller 110, the temperature sensor 121c may be configured to sense the temperature of the non-volatile memory device 120 and may be configured to provide the storage controller 110 with the temperature information TI as the write temperature information.

In some embodiments, the temperature sensor 121c may be configured to generate the read temperature information. For example, when the command indicating the read reclaim determination is received from the storage controller 110, the temperature sensor 121c may be configured to sense the temperature of the non-volatile memory device 120 and may be configured to provide the reclaim determiner 121b with the temperature information TI as the read temperature information. The reclaim determiner 121b may be configured to determine whether the read reclaim is required, in consideration of the temperature information TI.

The E-fuse circuit 121d may be configured to store the distribution information DI or the offset information under control of the distribution information generator 121a. The E-fuse circuit 121d may be configured to store a plurality of parameter values. The plurality of parameter values may be used to determine whether the read reclaim is required, based on a temperature condition or a condition of a read voltage level. The parameter values will be described in detail with reference to FIG. 15.

Under control of the control logic 121, the voltage generator 122 may be configured to control voltages to be applied to the memory cell array 124 through the row decoder 123.

The row decoder 123 may be configured to receive the row address ADDR from the control logic 121. The row decoder 123 may be connected with the memory cell array 124 through string selection lines SSL, word lines WL, and ground selection lines GSL. The row decoder 123 may be configured to decode the row address ADDR and may be configured to control voltages to be applied to the string selection lines SSL, the word lines WL, and the ground selection lines GSL based on a decoding result and a voltage(s) received from the voltage generator 122.

The memory cell array 124 may include a plurality of memory blocks BLK. Each memory block BLK may correspond to a physical erase unit of the non-volatile memory device 120, but embodiments of the present disclosure are not limited thereto. For example, the physical erase unit may be changed to a page unit, a word line unit, a sub-block unit, or the like.

The memory block BLK may include a plurality of memory cells. Each of the plurality of memory cells may store 2 or more bits. For example, the memory cell of the memory block BLK may be implemented with a memory cell, such as a multi-level cell storing 2 bits, a triple level cell storing 3 bits, and/or a quadruple level cell storing 4 bits.

The page buffer unit 125 may include a plurality of page buffers PB. The page buffer unit 125 may be connected with the memory cell array 124 through bit lines BL. The page buffer unit 125 may be configured to read data from the memory cell array 124 in units of page by sensing voltages of the bit lines BL under control of the control logic 121.

The column decoder 126 may be configured to receive the column address ADDC from the control logic 121. The column decoder 126 may be configured to decode the column address ADDC and may be configured to provide the data read by the page buffer unit 125 to the I/O circuit 127 based on a decoding result.

The column decoder 126 may be configured to receive data from the I/O circuit 127 through data lines DL. The column decoder 126 may be configured to receive the column address ADDC from the control logic 121. The column decoder 126 may be configured to decode the column address ADDC and may be configured to provide the data received from the I/O circuit 127 to the page buffer unit 125 based on a decoding result. The page buffer unit 125 may be configured to store the data provided from the I/O circuit 127 in the memory cell array 124 through the bit lines BL in units of page.

The I/O circuit 127 may be connected with the column decoder 126 through the data lines DL. The I/O circuit 127 may be configured to provide data received from the storage controller 110 to the column decoder 126 through the data lines DL. The I/O circuit 127 may output data received through the data lines DL to the storage controller 110.

Figure 4A:
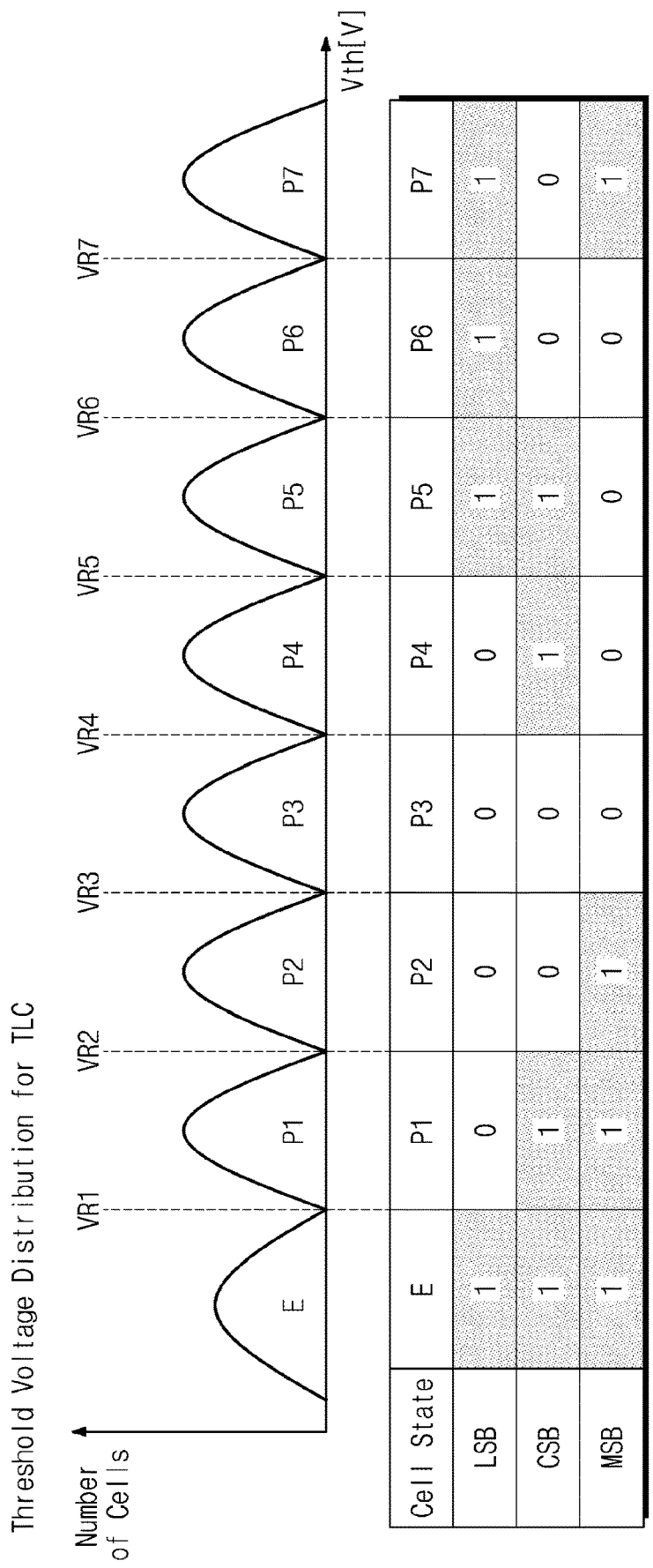
FIG. 4A is a diagram illustrating threshold voltage distributions of triple level cells, according to some embodiments of the present disclosure.

FIG. 4A is a diagram illustrating threshold voltage distributions of triple level cells according to some embodiments of the present disclosure. A graph of threshold voltage distributions of the triple level cells TLC each storing 3 bits and a bit table for each page corresponding to the threshold voltage distributions are illustrated in FIG. 4A.

In the graph of the triple level cell TLC, a horizontal axis represents a threshold voltage (e.g., a level of a threshold voltage), and a vertical axis represents the number of cells. The triple level cell TLC may have one of an erase state "E" and first to seventh programming states P1, P2, P3, P4, P5, P6, and P7 in which threshold voltage distributions sequentially increase.

In the triple level cell TLC, a first read voltage VR1 may indicate a voltage level for distinguishing the erase state "E" from the first programming state P1. Likewise, each of second to seventh read voltage levels VR2 to VR7 may indicate a voltage level for distinguishing each of the second to seventh programming states P2 to P7 from a previous state (i.e., an immediately previous state having a lower threshold voltage distribution).

Referring to the table of the triple level cell TLC, a least significant bit LSB, a center significant bit CSB, and a most significant bit MSB according to a cell state are illustrated. A physical page corresponding to the triple level cell TLC storing 3 bits may correspond to a first logical page, a second logical page, and a third logical page. In the triple level cell TLC, the first logical page may indicate the least significant bit LSB, the second logical page may indicate the center significant bit CSB, and the third logical page may indicate the most significant bit MSB.

In some embodiments, each of the first to seventh read voltages VR1 to VR7 of the triple level cell TLC may correspond to one of a plurality of logical pages. For example, in the triple level cell TLC, the read operation corresponding to the first logical page may be performed based on the first read voltage VR1 and the fifth read voltage VR5. The read operation corresponding to the second logical page may be performed based on the second read voltage VR2, the fourth read voltage VR4, and the sixth read voltage VR6. The read operation corresponding to the third logical page may be performed based on the third read voltage VR3 and the seventh read voltage VR7.

Figure 4B:
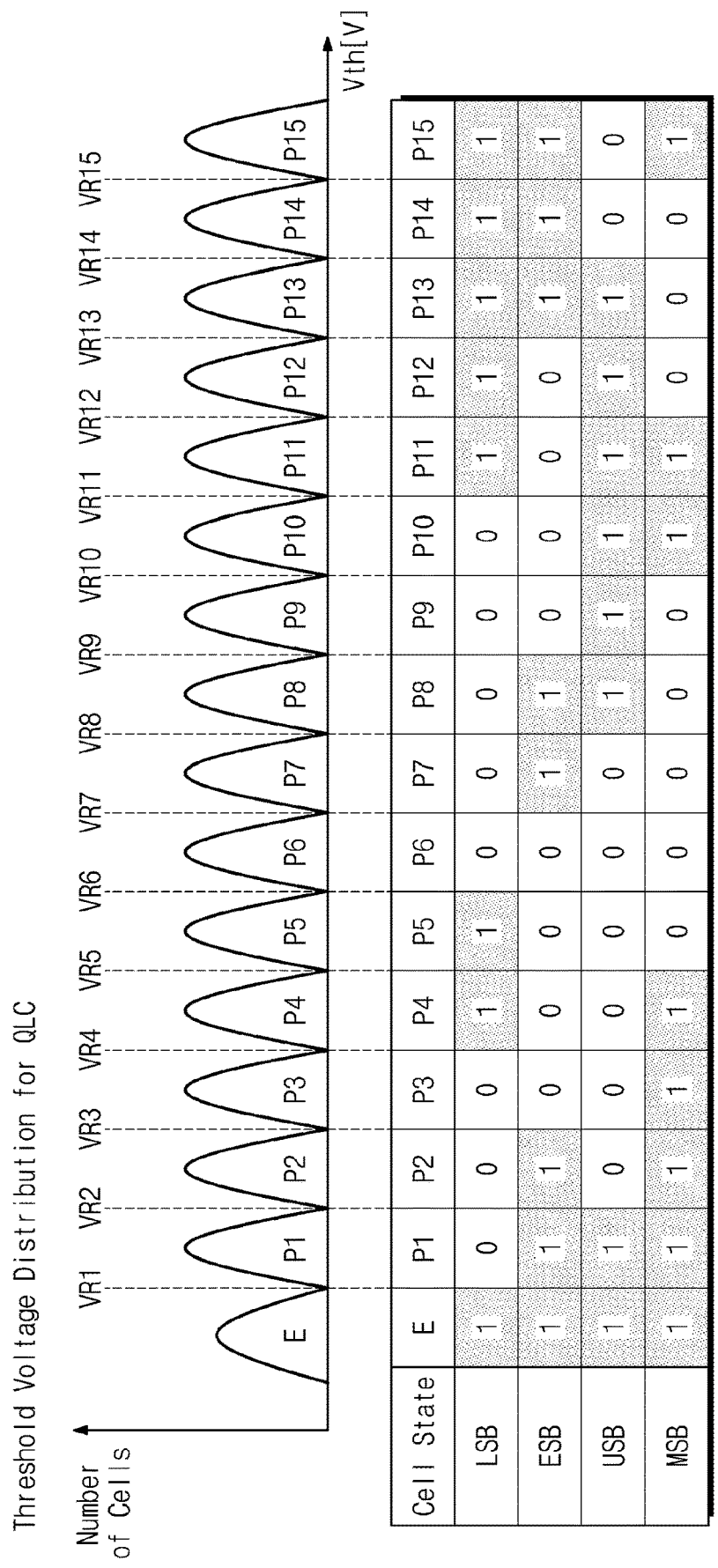
FIG. 4B is a diagram illustrating threshold voltage distributions for quadruple level cells, according to some embodiments of the present disclosure.

FIG. 4B is a diagram illustrating threshold voltage distributions for quadruple level cells, according to some embodiments of the present disclosure. A graph of threshold voltage distributions of the quadruple level cells each QLC storing 4 bits and a bit table for each page corresponding to the threshold voltage distributions are illustrated in FIG. 4B.

In the graph of the quadruple level cell QLC, a horizontal axis represents a threshold voltage (e.g., a level of a threshold voltage), and a vertical axis represents the number of cells. The quadruple level cell QLC may have one of an erase state "E" and first to fifteenth programming states P1, P2, P3, P4, P5, P6, P7, P8, P9, P10, P11, P12, P13, P14, and P15 in which threshold voltage distributions sequentially increase.

In the quadruple level cell QLC, a first read voltage VR1 may indicate a voltage level for distinguishing the erase state "E" from the first programming state P1. Likewise, each of second to fifteenth read voltage levels VR2 to VR15 may indicate a voltage level for distinguishing each of the second to fifteenth programming states P2 to P15 from a previous state (i.e., an immediately previous state having a lower threshold voltage distribution).

Referring to the table of the quadruple level cell QLC, a least significant bit LSB, a first center significant bit ESB, a second center significant bit USB, and a most significant bit MSB according to a cell state are illustrated. A physical page corresponding to the quadruple level cell QLC storing 4 bits may correspond to a first logical page, a second logical page, a third logical page, and a fourth logical page. In the quadruple level cell QLC, the first logical page may indicate the least significant bit LSB, the second logical page may indicate the first center significant bit ESB, the third logical page may indicate the second center significant bit USB, and the fourth logical page may indicate the most significant bit MSB.

In some embodiments, each of the first to fifteenth read voltages VR1 to VR15 of the quadruple level cell QLC may correspond to one of a plurality of logical pages. For example, in the quadruple level cell QLC, the read operation corresponding to the first logical page may be performed based on the first, fourth, sixth, and eleventh read voltages VR1, VR4, VR6, and VR11. The read operation corresponding to the second logical page may be performed based on the third, seventh, ninth, and thirteenth read voltages VR3, VR7, VR9, and VR13. The read operation corresponding to the third logical page may be performed based on the second, eighth, and fourteenth read voltages VR2, VR8, and VR14. The read operation corresponding to the fourth logical page may be performed based on the fifth, tenth, twelfth, and fifteenth read voltages VR5, VR10, VR12, and VR15.

As described above, the states and the read voltage levels of the triple level cell TLC, and the quadruple level cell QLC are described with reference to FIGS. 4A and 4B. However, embodiments of the present disclosure are not limited thereto. For example, one skilled in the art may understand that read voltages corresponding to each logical page are variously changed or modified and one memory cell is implemented with a multi-level cell (MLC) or may be implemented with a memory cell storing 4 or more bits.

Figure 5:
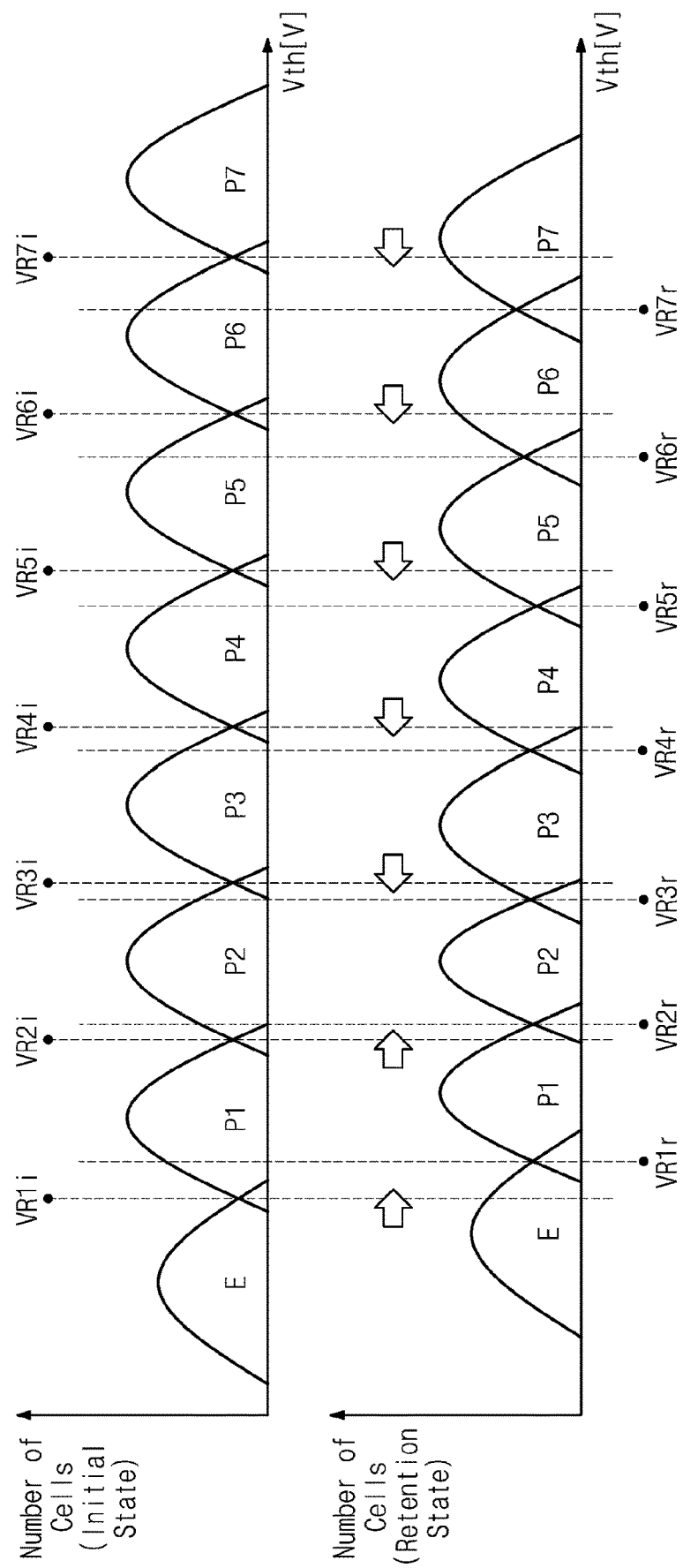
FIG. 5 is a diagram illustrating a change of a threshold voltage distribution, according to some embodiments of the present disclosure.

FIG. 5 is a diagram illustrating a change of a threshold voltage distribution according to some embodiments of the present disclosure. Threshold voltage distributions of an initial state and threshold voltage distributions of a retention state will be described with reference to FIG. 5. The initial state may refer to a state at a time (i.e., an initial time) when memory cells are programmed to form threshold voltage distributions. The retention state may refer to a state at a time when a given time passes from the initial state or a state at a time when the command indicating the read reclaim determination is processed.

In the graph of the initial state, a horizontal axis represents a threshold voltage (e.g., a level of a threshold voltage), and a vertical axis represents the number of memory cells. A threshold voltage level of each memory cell may correspond to one of the erase state "E" and the first to seventh programming states P1 to P7. A first initial read voltage level VR1$i$ may be a voltage level of a valley optimized to distinguish memory cells of the erase state "E" from memory cells of the first programming state P1.

The optimized valley may indicate a voltage level at which the number of memory cells having an error bit (i.e., memory cells each determined as a bit opposite to a programmed bit is stored) is minimum. For example, in the case of distinguishing the erase state "E" and the first programming state P1 in the initial state, the voltage level of the optimized valley may indicate a voltage level, at which the number of memory cells is minimized, between a voltage level at which the number of memory cells having the erase state "E" is maximized and a voltage level at which the number of memory cells having the first programming state P1 is maximized. In other words, the voltage level of the optimized valley associated with the erase state "E" and the first programming state P1 in the initial state may be the first initial read voltage level VR1$i$.

As in the above description, in the initial state, each of second to seventh initial read voltage levels VR2$i$ to VR7$i$ may indicate a voltage level of the valley optimized to distinguish each of the second to seventh programming state P2 to P7 from a previous state (i.e., an immediately previous state having a lower threshold voltage distribution).

In the graph of the retention state, a horizontal axis represents a threshold voltage (e.g., a level of a threshold voltage), and a vertical axis represents the number of memory cells. A threshold voltage level of each memory cell may correspond to one of the erase state "E" and the first to seventh programming states P1 to P7. A first retention read voltage level VR1$r$ may be a voltage level of a valley optimized to distinguish memory cells of the erase state "E" from memory cells of the first programming state P1. As in the above description, in the retention state, each of second to seventh retention read voltage levels VR2$r$ to VR7$r$ may indicate a voltage level of the valley optimized to distinguish each of the second to seventh programming state P2 to P7 from a previous state (i.e., an immediately previous state having a lower threshold voltage distribution).

Referring to the graph of the initial state and the graph of the retention state together, each of the first to seventh initial read voltage levels VR1$i$ to VR7$i$ may be different from each of the first to seventh retention read voltage levels VR1$r$ to VR7$r$.

In some embodiments, as the threshold voltage level becomes higher, a variation in the voltage level in the retention state may become greater. For example, a difference between the third retention read voltage level VR3$r$ and the third initial read voltage level VR3$i$ may be greater than a difference between the seventh retention read voltage level VR7$r$ and the seventh initial read voltage level VR7$i$.

In some embodiments, a voltage level corresponding to a low threshold voltage state may increase over time. For example, to improve a time during which the reliability of an erase state and plural programming states is guaranteed or maintained, memory cells may be programmed to have a voltage level higher than the voltage level of the erase state in a semiconductor process level. In an actual use level, the memory cell programmed to the erase state may have a property of returning to the voltage level programmed in the semiconductor process level over time. As such, the first retention read voltage level VR1r may be higher than the first initial read voltage level VR1i.

According to an embodiment of the present disclosure, the non-volatile memory device 120 of FIG. 1 may individually obtain distribution information for each read voltage level in consideration of a degradation trend according to the retention of memory cells and may determine whether the read reclaim is required, based on the distribution information.

Figure 6:
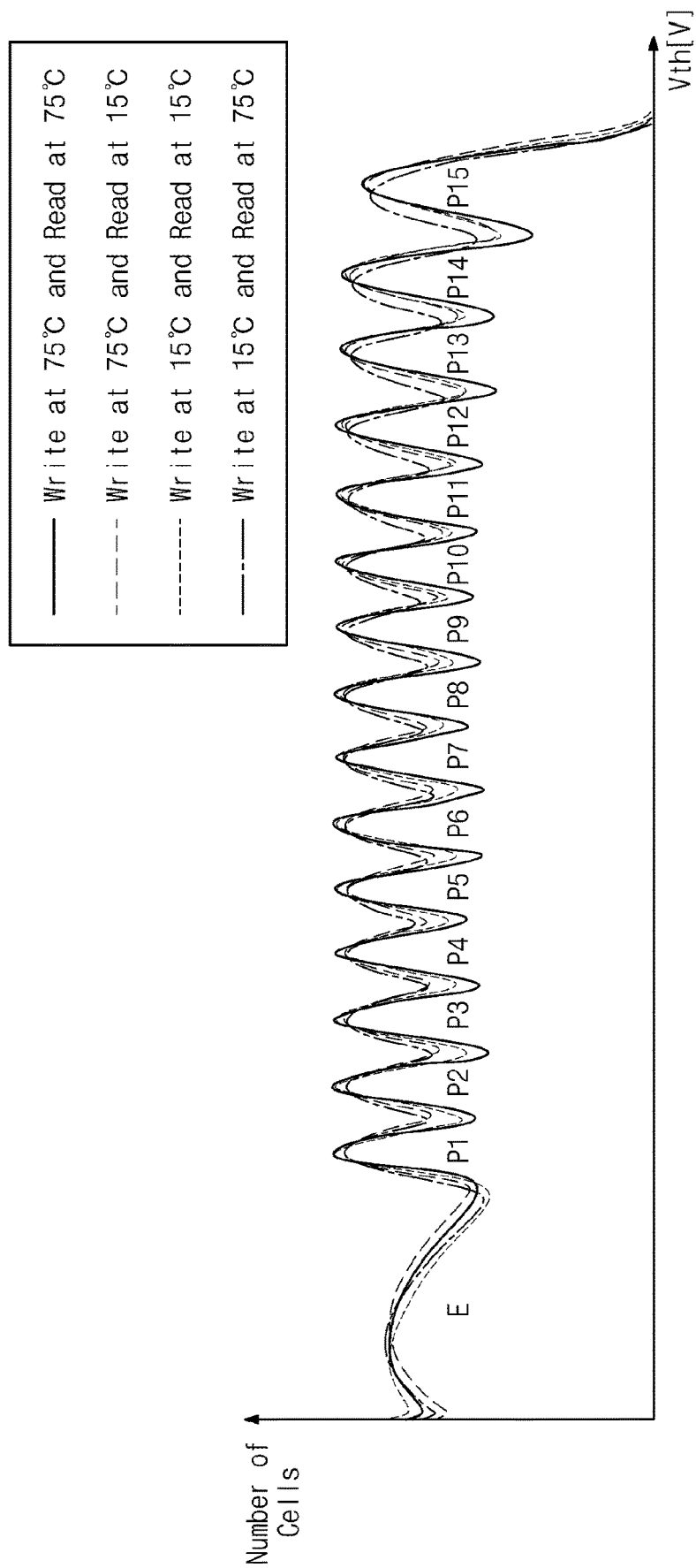
FIG. 6 is a diagram illustrating a relationship between temperature information and threshold voltage distributions, according to some embodiments of the present disclosure.

FIG. 6 is a diagram illustrating a relationship between temperature information and threshold voltage distributions according to some embodiments of the present disclosure. Referring to FIGS. 1 and 6, threshold voltage distributions of the quadruple level cell QLC according to various temperature conditions are illustrated. In FIG. 6, a horizontal axis represents a threshold voltage, and a vertical axis represents the number of memory cells.

The write temperature information may indicate a temperature sensed by the temperature sensor 121c when data are stored in the non-volatile memory device 120.

The read temperature information may indicate a temperature sensed by the temperature sensor 121c when data are read to generate the distribution information that is used to determine whether the read reclaim is required.

In an embodiment where the write temperature information is 75° C. and the read temperature information is 75° C., a threshold voltage distribution is illustrated by a solid line. In an embodiment where the write temperature information is 75° C. and the read temperature information is 15° C., a threshold voltage distribution is illustrated by a dashed line. In an embodiment where the write temperature information is 15° C. and the read temperature information is 15° C., a threshold voltage distribution is illustrated by a dotted line. In an embodiment where the write temperature information is 15° C. and the read temperature information is 75° C., a threshold voltage distribution is illustrated by a dash-single dotted line.

As described above, the threshold voltage distribution may change depending on a temperature sensed when the write operation is performed and a temperature sensed when the read operation is performed. The write temperature information and the read temperature information may be used to accurately determine whether the read reclaim is required.

Figure 7:
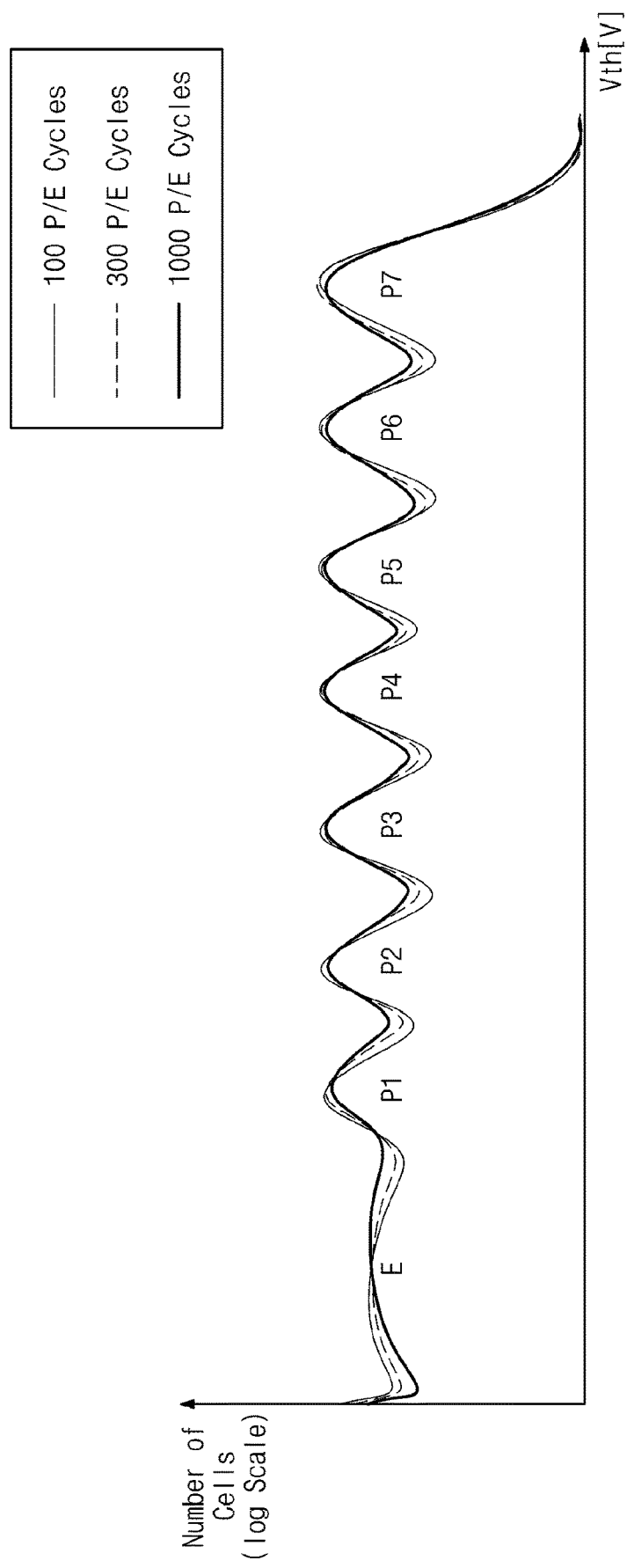
FIG. 7 is a diagram illustrating a relationship between program/erase (P/E) cycles and threshold voltage distributions, according to some embodiments of the present disclosure.

FIG. 7 is a diagram illustrating a relationship between program/erase (P/E) cycles and threshold voltage distributions, according to some embodiments of the present disclosure. Referring to FIGS. 1 and 7, threshold voltage distributions of the triple level cell TLC according to various P/E cycle conditions are illustrated. In FIG. 7, a horizontal axis represents a threshold voltage, and a vertical axis represents the number of memory cells. In the non-volatile memory device 120, the P/E cycle may indicate a cycle of a program operation where a state of a threshold voltage is changed to a programming state to store data and an erase operation where a state of a threshold voltage is changed to an erase state to erase data.

In an embodiment where the number of PIE cycles is "100," a threshold voltage distribution is illustrated by a solid line. In an embodiment where the number of P/E cycles is "300," a threshold voltage distribution is illustrated by a dashed line. In an embodiment where the number of P/E cycles is "1000," a threshold voltage distribution is illustrated by a bold solid line.

As described above, the threshold voltage distribution may change depending on the number of P/E cycles. The P/E cycle information may be used to accurately determine whether the read reclaim is required.

Figure 8:
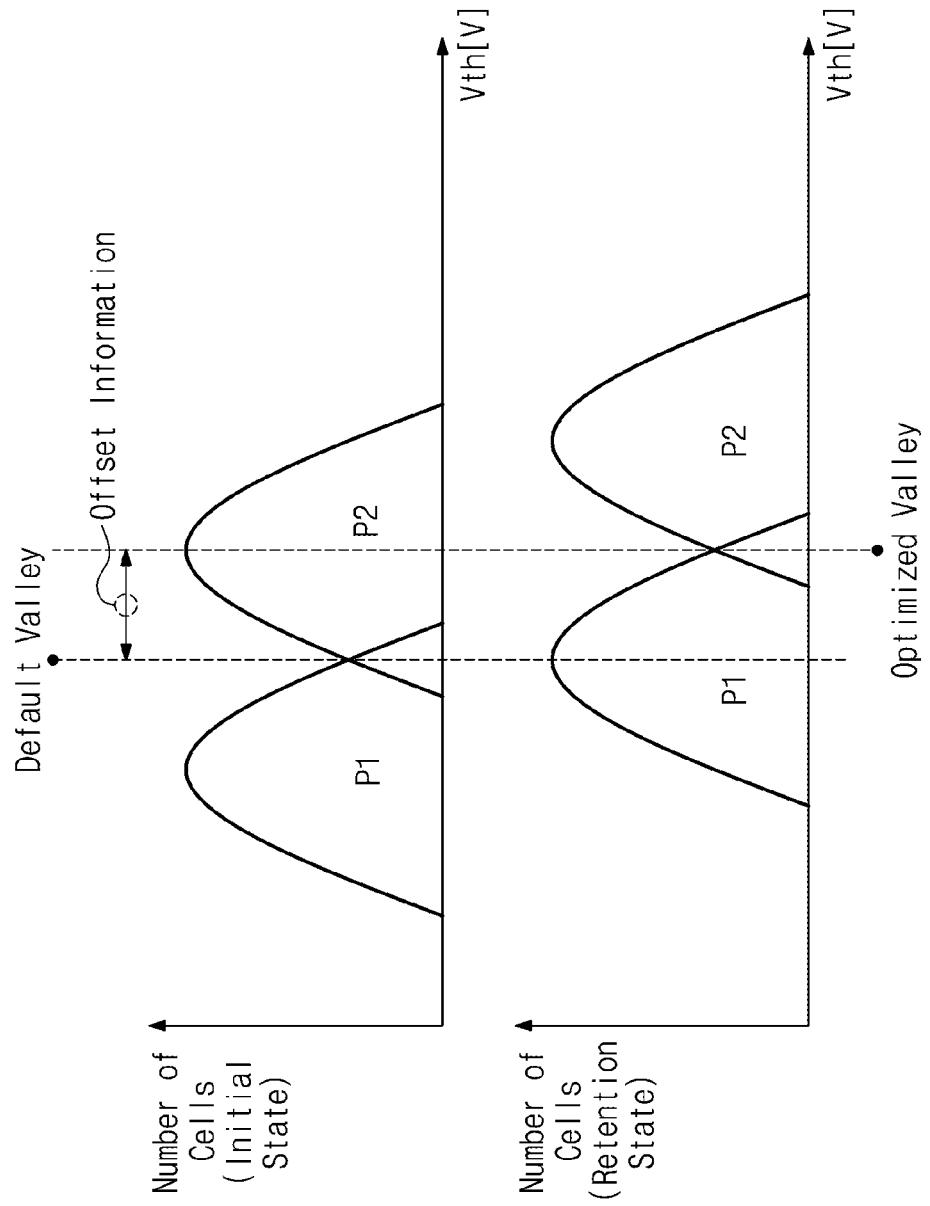
FIG. 8 is a diagram illustrating offset information, according to some embodiments of the present disclosure.

FIG. 8 is a diagram illustrating offset information according to some embodiments of the present disclosure. Referring to FIGS. 1 and 8, some threshold voltage distributions of the initial state and some threshold voltage distributions of the retention state are illustrated.

In the graph of the initial state, a horizontal axis represents a threshold voltage, and a vertical axis represents the number of memory cells. A default valley may refer to a voltage level optimized to distinguish memory cells of the first programming state P1 from memory cells of the second programming state P2. In detail, in the initial state, the default valley may indicate a voltage level, at which the number of memory cells is minimized, between a voltage level at which the number of memory cells having the first programming state P1 is maximized and a voltage level at which the number of memory cells having the second programming state P2 is maximized.

In the graph of the retention state, a horizontal axis represents a threshold voltage, and a vertical axis represents the number of memory cells. In the retention state, the optimized valley may indicate a voltage level optimized to distinguish memory cells of the first programming state P1 from memory cells of the second programming state P2. In detail, in the retention state, the optimized valley may indicate a voltage level, at which the number of memory cells is minimized, between a voltage level at which the number of memory cells having the first programming state P1 is maximized and a voltage level at which the number of memory cells having the second programming state P2 is maximized.

The offset information may indicate a difference between the optimized valley and the default valley. As time passes from the initial state, the size of the offset information (e.g., a difference between the voltage level of the optimized valley and the voltage level of the default valley) may increase.

The storage controller 110 may be configured to perform the read operation based on the default read voltage level or may be configured to perform the read operation based on the read voltage level optimized based on the offset information. In the case of using the optimized read voltage level, even though memory cells of the non-volatile memory device 120 are degraded, an error level of read data may be determined to be low. To accurately determine whether the read reclaim is required, the command manager 111 may provide the non-volatile memory device 120 with the command indicating the read reclaim determination and the offset information. The reclaim determiner 121b may determine whether the read reclaim is required based on the distribution information and the offset information.

For better understanding of embodiments of the present disclosure, FIG. 8 shows the case where the voltage level of the optimized valley is higher than the voltage level of the default valley, but embodiments of the present disclosure are not limited thereto. For example, depending on the number of bits managed by one memory cell, a semiconductor process method may vary, a read voltage level may vary, the voltage level of the optimized valley may be lower than the voltage level of the default valley, and the size of the offset information may increase or decrease.

Figure 9:
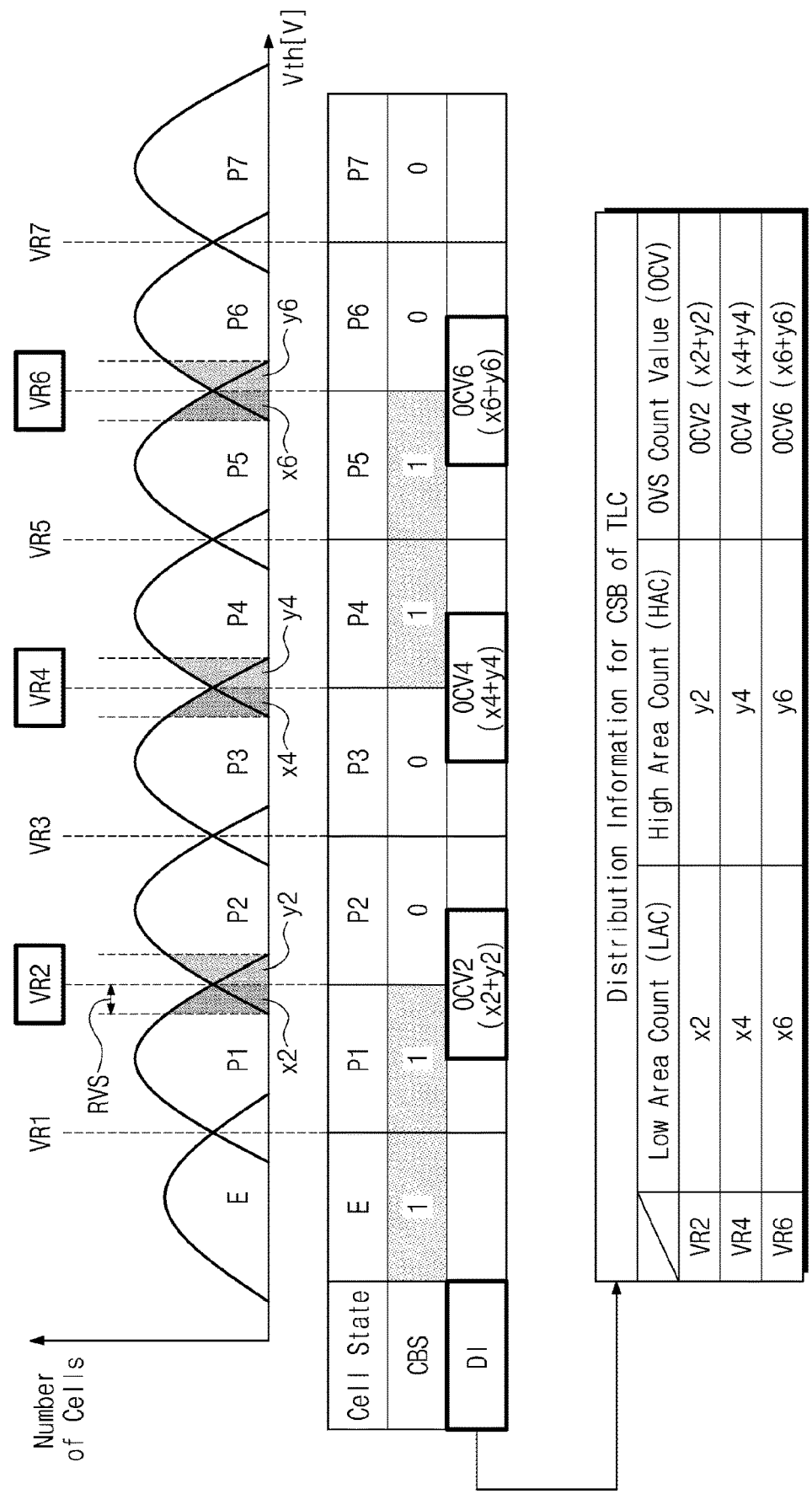
FIG. 9 is a diagram illustrating distribution information, according to some embodiments of the present disclosure.

FIG. 9 is a diagram illustrating distribution information according to some embodiments of the present disclosure. The distribution information may include OVS count data. An example where the OVS count data are used as an example of the distribution information in the case of reading the center significant bit CSB of the triple level cell TLC will be described with reference of the FIG. 9. The OVS count data may include OVS count values respectively corresponding to read voltages.

In the threshold voltage distribution graph, a horizontal axis represents a threshold voltage, and a vertical axis represents the number of memory cells. The second, fourth, and sixth read voltage levels VR2, VR4, VR6 may correspond to a logical page of the center significant bit CSB of the triple level cell TLC.

Referring to the threshold voltage distribution graph, "x2" may be a value of the low area count LAC of the second read voltage level VR2. "x2" may be a value that is obtained by counting the number of memory cells each having a threshold voltage between the second read voltage level VR2 and a voltage lower than the second read voltage level VR2 as much as a reference voltage section or amount RVS. "y2" may be a value of the high area count HAC of the second read voltage level VR2. "y2" may be a value that is obtained by counting the number of memory cells each having a threshold voltage between the second read voltage level VR2 and a voltage higher than the second read voltage level VR2 as much as the reference voltage section or amount RVS. A sum of "x2" and "y2" may be referred to as a "second OVS count value OCV2 of the second read voltage level VR2."

As in the above description, "x4" may be a value of the low area count LAC of the fourth read voltage level VR4. "y4" may be a value of the high area count HAC of the fourth read voltage level VR4. A sum of "x4" and "y4" may be referred to as a "fourth OVS count value OCV4 of the fourth read voltage level VR4." Also, "x6" may be a value of the low area count LAC of the sixth read voltage level VR6. "y6" may be a value of the high area count HAC of the sixth read voltage level VR6. A sum of "x6" and "y6" may be referred to as a "sixth OVS count value OCV6 of the sixth read voltage level VR6."

According to some embodiments of the present disclosure, the distribution information may include the OVS count data. For example, when the memory cell is implemented with the triple level cell TLC, the OVS count data may include first and fifth OVS count values corresponding to the least significant bit LSB, second, fourth, and sixth OVS count values corresponding to the center significant bit CSB, and third and seventh OVS count values corresponding to the most significant bit MSB.

Figure 10A:
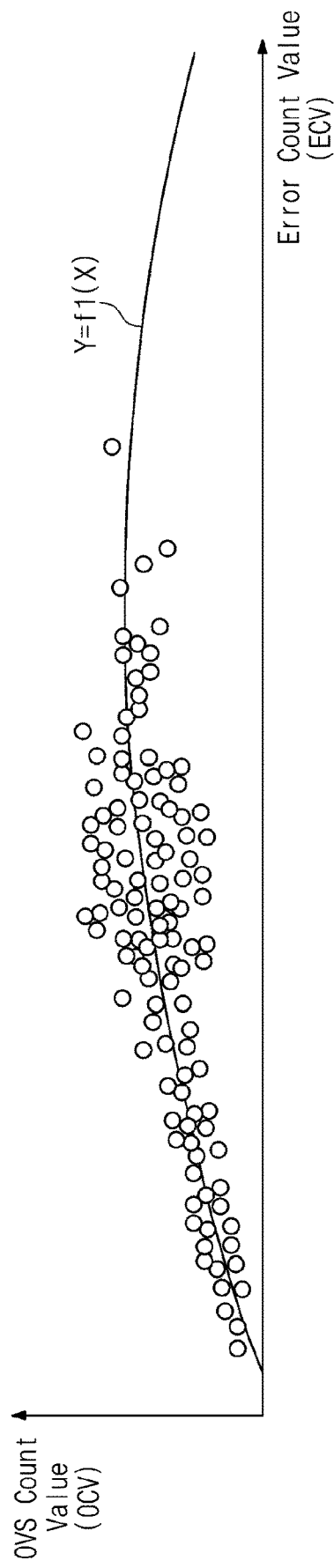
FIG. 10A is a diagram illustrating a relationship between an on-chip valley search (OVS) count value and an error count value, according to some embodiments of the present disclosure.
Figure 10B:
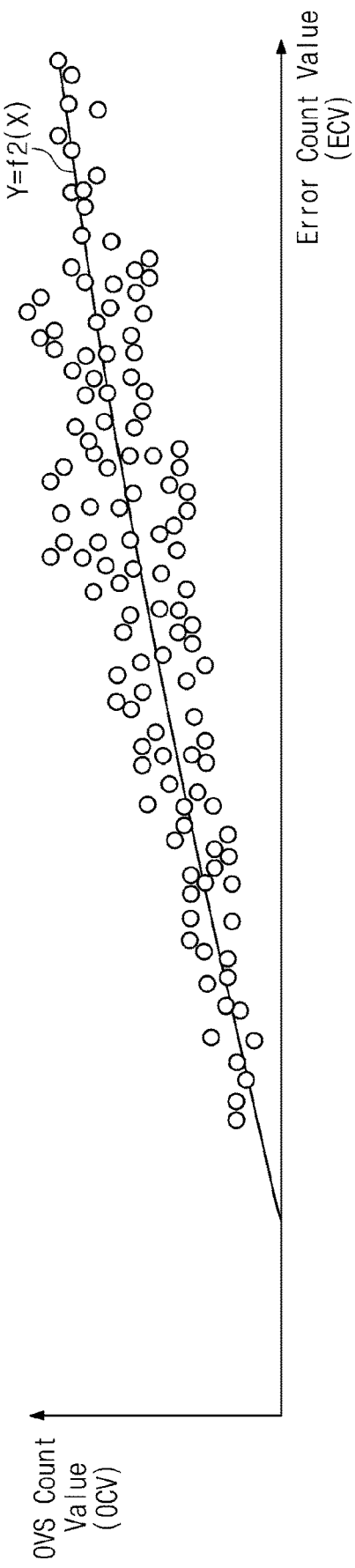
FIG. 10B is a diagram illustrating a relationship between an OVS count value and an error count value, according to some embodiments of the present disclosure.

FIG. 10A is a diagram illustrating a relationship between an OVS count value and an error count value according to some embodiments of the present disclosure. FIG. 10B is a diagram illustrating a relationship between an OVS count value and an error count value according to some embodiments of the present disclosure.

Referring to FIGS. 10A and 10B, a plurality of pairs of an OVS count value and an error count value and a function model of a correspondence relationship drawn therefrom will be described. A horizontal axis represents the error count value ECV. A vertical axis represents the OVS count value OCV.

In some embodiments, a plurality of pairs of the OVS count value OCV and the error count value ECV associated with the target read voltage level may have a non-linear correspondence relationship. For example, the command indicating the read reclaim determination may include the target read voltage level. The target read voltage level may be used to determine bit values of memory cells in the on-chip read operation. One or both of a low area count value and a high area count value among the OVS count value OCV may have the non-linear correspondence relationship with regard to the error count value ECV corresponding to the target read voltage level. The non-linear correspondence relationship may be referred to as a "first function model f1" (refer to FIG. 10A).

In some embodiments, the plurality of pairs of the OVS count value OCV and the error count value ECV associated with the target read voltage level may have a linear correspondence relationship. For example, the command indicating the read reclaim determination may include the target read voltage level. One or both of a low area count value and a high area count value among the OVS count value OCV may have the linear correspondence relationship with regard to the error count value ECV corresponding to the target read voltage level. The linear correspondence relationship may be referred to as a "second function model f2" (refer to FIG. 10B).

Figure 11:
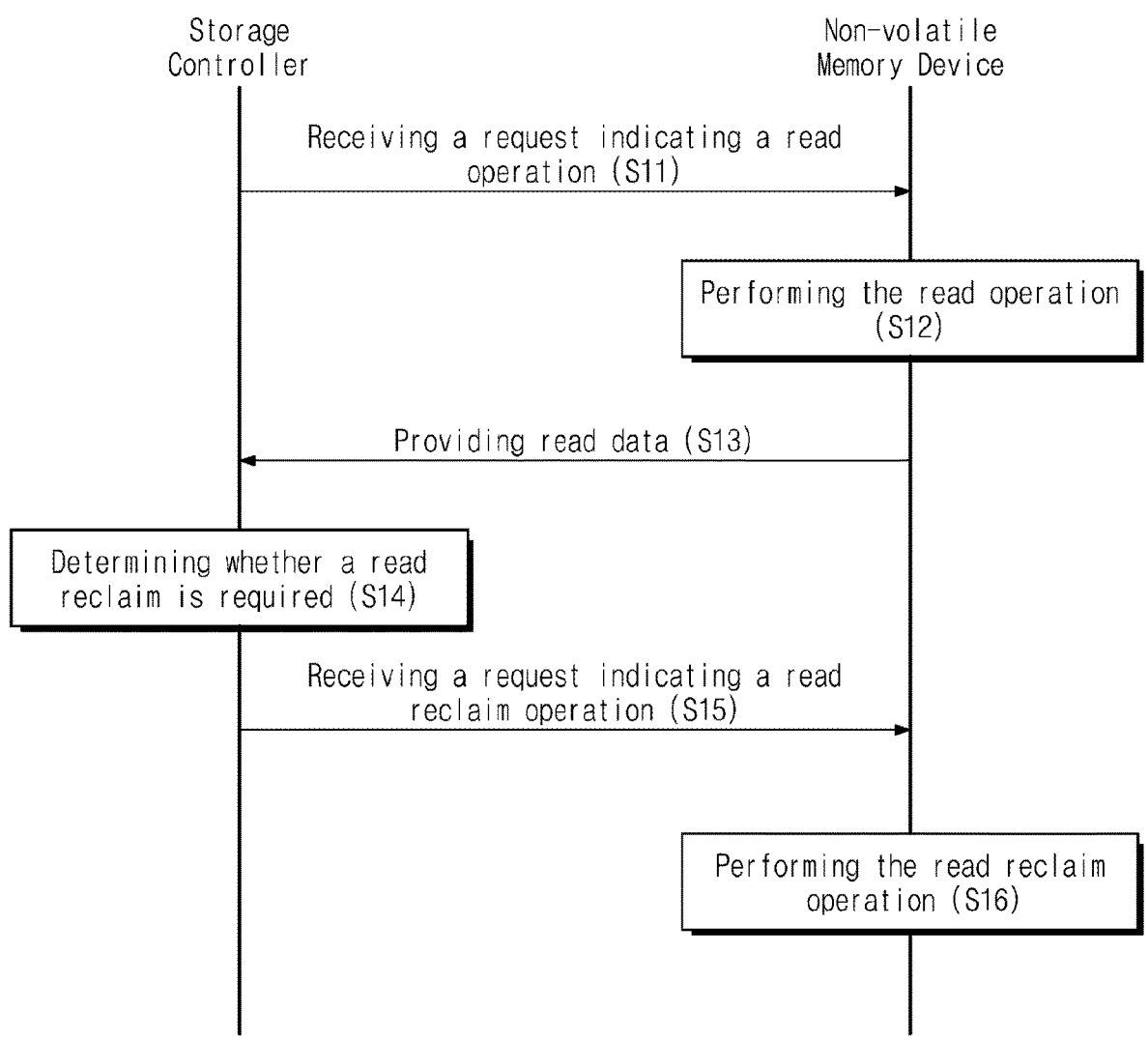
FIG. 11 is a flowchart illustrating a method of operating a conventional storage device.

FIG. 11 is a flowchart illustrating a method of operating a conventional storage device. The conventional storage device is provided for better understanding of the present disclosure and is not intended to limit the scope of the present disclosure. The conventional storage device may include characteristics associated with the present disclosure.

Referring to FIG. 11, the storage device may include a storage controller and a non-volatile memory device.

In operation S11, the non-volatile memory device may receive a request indicating a read operation from the storage controller. The request may include the read command the target read voltage level. In this case, the read operation may not be associated with a host request and may be a dummy read operation for guaranteeing or maintaining the reliability of the non-volatile memory device. The dummy read operation may refer to an operation, which is performed based on a health check algorithm (e.g., a defense code) of a firmware module of the storage controller, such as a patrol read operation or a read interval neighbor check (RINC) operation.

In operation S12, the non-volatile memory device may perform the read operation. In operation S13, the non-volatile memory device may provide the read data to the storage controller. The read data may indicate a degradation level of the non-volatile memory device, or distribution information indicating the degradation level may be provided to the storage controller together with the read data.

In operation S14, the storage controller may determine whether the read reclaim is required. The storage controller may perform operation S15 in response to determining that the read reclaim is required. In operation S15, the non-volatile memory device may receive a request indicating a read reclaim operation from the storage controller. In operation S16, the non-volatile memory device may perform the read reclaim operation.

As described above, the non-volatile memory device of the conventional storage device may provide the read data or the distribution information whenever performing the dummy read operation for guaranteeing or maintaining the reliability. The transfer of the read data or the distribution information may cause an increase of the I/O load between the non-volatile memory device and the storage controller. In general, the dummy read operation may be frequently performed in the situation where the non-volatile memory device is degraded (e.g., in the end of life (EOL) situation). To frequently transfer the read data or the distribution information in the degraded situation may cause a reduction of performance of the storage device or a decrease of the life of the storage device.

Figure 12:
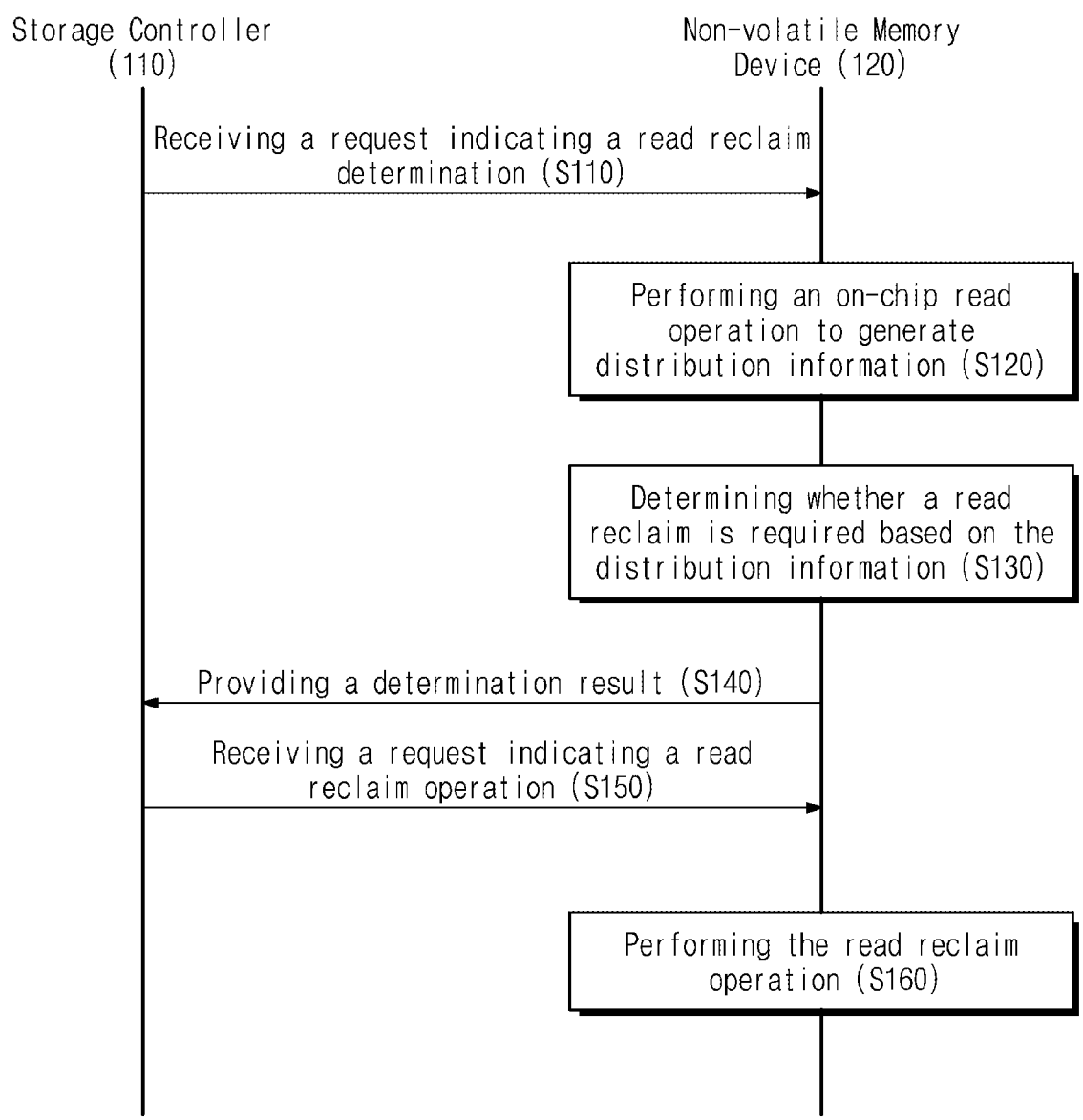
FIG. 12 is a flowchart illustrating a method of operating a storage device, according to some embodiments of the present disclosure.

FIG. 12 is a flowchart illustrating a method of operating a storage device according to some embodiments of the present disclosure. The storage device may correspond to the storage device 100 of FIG. 1. Referring to FIGS. 1 and 12, the storage device 100 may include the storage controller 110 and the non-volatile memory device 120.

In operation S110, the non-volatile memory device 120 may receive the request indicating the read reclaim determination from the storage controller 110. For example, the request may include the command indicating the read reclaim determination, the target read voltage level, and environment information. The target read voltage level may be used in the on-chip read operation of the non-volatile memory device 120. The environment information may include a variety of information contributing to the read reclaim determination.

For example, the environment information may include offset information indicating a difference between the optimized valley and the default valley, write temperature information when target data corresponding to the on-chip read operation are stored in the non-volatile memory device 120, the number of P/E cycles of the non-volatile memory device 120, a count value of the read operation for target data corresponding to the on-chip read operation, maximum ECC information corresponding to the error correction capability of an ECC engine of the storage controller 110, and/or word line information indicating whether coupled word lines are present in a memory block storing the target data.

In operation S120, the non-volatile memory device 120 may perform the on-chip read operation for generating the distribution information. For example, the non-volatile memory device 120 may perform the on-chip read operation based on the target read voltage level included in the request indicating the read reclaim determination operation S110 and may obtain the read data, in this case, the non-volatile memory device 120 may generate the distribution information as the byproduct of the read data.

In operation S130, the non-volatile memory device 120 may determine whether the read reclaim is required, based on the distribution information. In some embodiments, the non-volatile memory device 120 may determine whether the read reclaim is required, based on the distribution information and the environment information included in the request indicating the read reclaim determination operation S110.

In operation S140, the non-volatile memory device 120 may provide a determination result to the storage controller 110. For example, when it is determined in operation S130 that the read reclaim is required, the non-volatile memory device 120 may provide the storage controller 110 with the determination result having the first bit value. When it is determined in operation S130 that the read reclaim is not required, the non-volatile memory device 120 may provide the storage controller 110 with the determination result having the second bit value. The determination result may be implemented with a 1-bit response signal. The event that the non-volatile memory device 120 provides the determination result to the storage controller 110 may have a small influence on the reduction of performance of the storage device 100 or the decrease in the life of the storage device 100.

In operation S150, the non-volatile memory device 120 may receive the request indicating the read reclaim operation from the storage controller 110. For example, in operation S130, the non-volatile memory device 120 may determine that the read reclaim is required, in operation S140, the non-volatile memory device 120 may provide the storage controller 110 with the determination result having the first bit value. In response to the determination result having the first bit value, the storage controller 110 may provide the non-volatile memory device 120 with the request indicating the read reclaim operation.

In operation S160, the non-volatile memory device 120 may perform the read reclaim operation.

As described above, according to embodiments of the present disclosure, the non-volatile memory device 120 may determine whether the read reclaim is required and may provide the determination result to the storage controller 110. As such, the latency and the I/O load between the storage controller 110 and the non-volatile memory device 120 in the dummy read operations for guaranteeing or maintaining the reliability may decrease.

Figure 13:
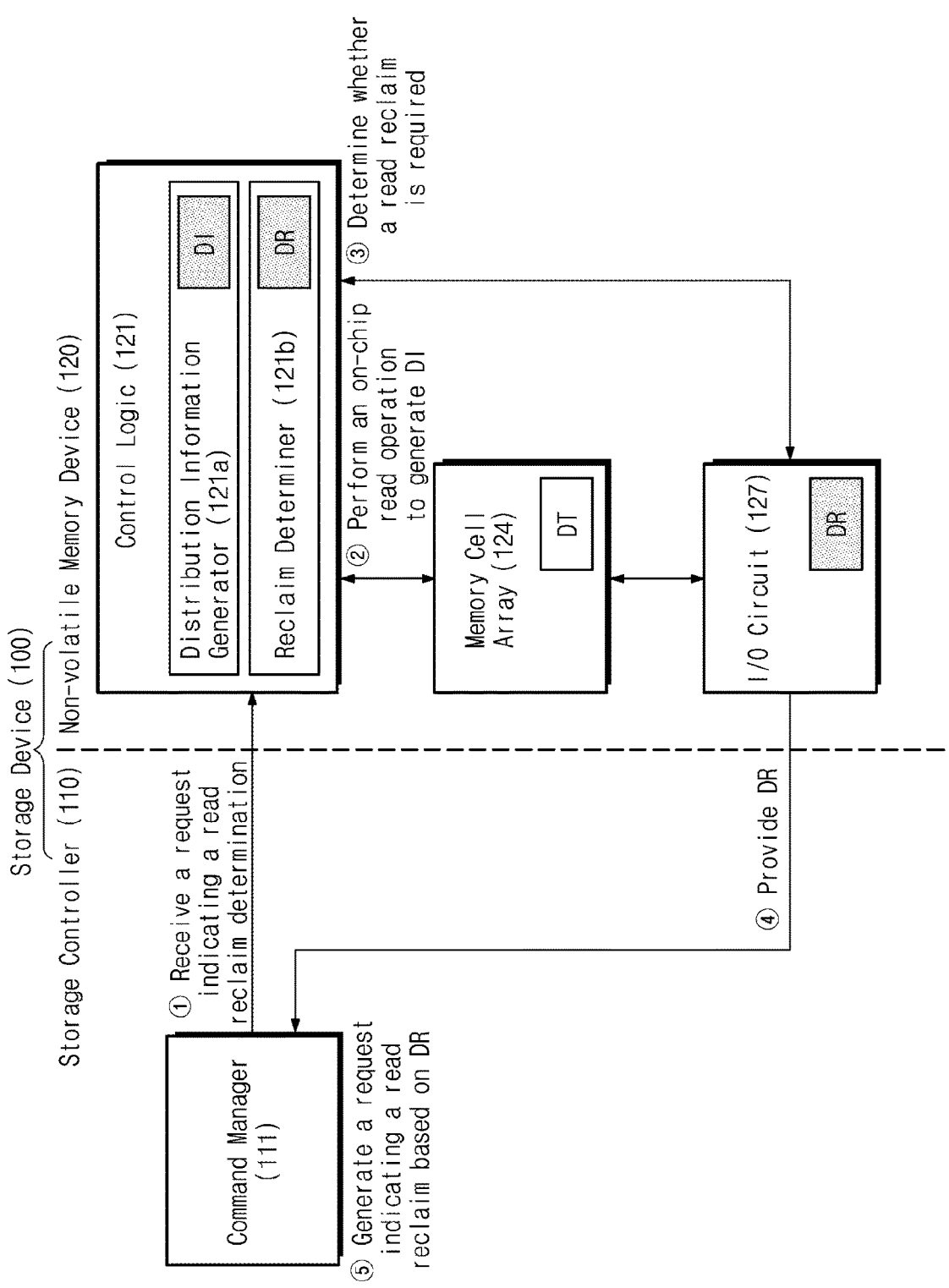
FIG. 13 is a diagram illustrating a method of operating a storage device, according to some embodiments of the present disclosure.

FIG. 13 is a diagram illustrating a method of operating a storage device according to some embodiments of the present disclosure. The storage device may correspond to the storage device 100 of FIG. 1. Referring to FIGS. 1 and 13, the storage device 100 may include the storage controller 110 and the non-volatile memory device 120. The storage controller 110 may include the command manager 111. The non-volatile memory device 120 may include the control logic 121, the memory cell array 124, and the I/O circuit 127. The control logic 121 may include the distribution information generator 121a and the reclaim determiner 121b.

Below, the method of operating the storage device 100 according to some embodiments of the present disclosure will be described in detail.

In a first operation ①, the control logic 121 may receive the request indicating the read reclaim determination from the command manager 111. The request may include the target read voltage level that is used in the on-chip read operation for reading the data DT stored in the memory cell array 124.

In a second operation ②, the control logic 121 may perform the on-chip read operation for generating the distribution information DI. For example, the control logic 121 may perform the on-chip read operation based on the target read voltage level included in the request of the first operation ①. The distribution information generator 121a may generate the distribution information DI while data DT of the memory cell array 124 are read by the on-chip read operation. The distribution information DI may indicate the degradation level of the data DT of the memory cell array 124.

In a third operation ③, the control logic 121 may determine whether the read reclaim is required based on the distribution information DI. For example, the reclaim determiner 121b may determine whether the read reclaim for the data DT of the memory cell array 124 is required based on the distribution information DI generated by the distribution information generator 121a. When it is determined that the read reclaim is required, the reclaim determiner 121b may generate the determination result DR having the first bit value. When it is determined that the read reclaim is not required, the reclaim determiner 121b may generate the determination result DR having the second bit value. The reclaim determiner 121b may provide the determination result DR to the I/O circuit 127.

In a fourth operation ④, the non-volatile memory device 120 may provide the determination result DR to the storage controller 110. For example, the I/O circuit 127 may provide the command manager 111 with the determination result DR received from the control logic 121.

In a fifth operation ⑤, the command manager 111 may generate the request indicating the read reclaim operation based on the determination result DR. For example, when the determination result DR has the first bit value, the command manager 111 may generate the command indicating the read reclaim operation. As another example, when the determination result DR has the second bit value, the command manager 111 may generate the command indicating the read operation or the read reclaim determination.

Figure 14:
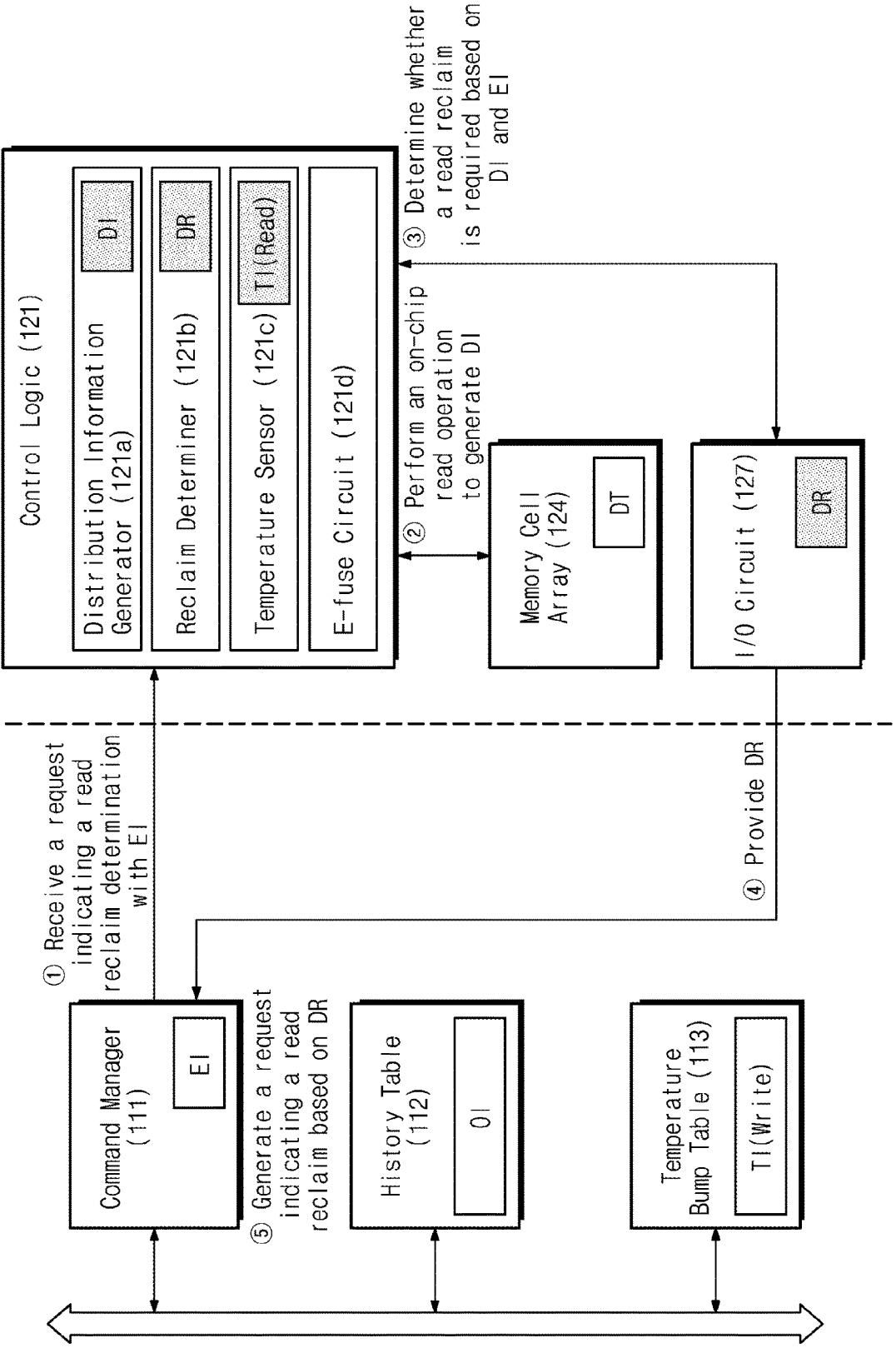
FIG. 14 is a flowchart illustrating a method of operating a storage device, according to some embodiments of the present disclosure.

FIG. 14 is a flowchart illustrating a method of operating a storage device according to some embodiments of the present disclosure. The storage device may correspond to the storage device 100 of FIG. 1. Referring to FIGS. 1 and 14, the storage device 100 may include the storage controller 110 and the non-volatile memory device 120.

The storage controller 110 may include the command manager 111, the history table 112, and the temperature bump table 113.

The non-volatile memory device 120 may include the control logic 121, the memory cell array 124, and the I/O circuit 127. The control logic 121 may include the distribution information generator 121a, the reclaim determiner 121b, the temperature sensor 121c, and the E-fuse circuit 121d.

Below, the method of operating the storage device 100 according to some embodiments of the present disclosure will be described in detail.

In a first operation ①, the control logic 121 may receive the request indicating the read reclaim determination from the command manager 111. The request may include the target read voltage level that is used in the on-chip read operation for reading the data DT stored in the memory cell array 124. The request may include environment information EI. The environment information EI may contribute to accurately determine whether the read reclaim is required.

For example, the environment information EI may include the offset information OI indicating a difference between the optimized valley and the default valley, write temperature information when target data corresponding to the on-chip read operation are stored in the non-volatile memory device 120, the number of P/E cycles of the non-volatile memory device 120, a count value of the read operation for target data corresponding to the on-chip read operation, maximum ECC information corresponding to the error correction capability of the ECC engine of the storage controller 110, and/or word line information indicating whether coupled word lines are present in a memory block storing the target data.

In some embodiments, the command manager 111 may generate the environment information EI based on the offset information OI of the history table 112. The offset information OI of the history table 112 may correspond to distribution information of the read operation that is performed before the request of the first operation ① is generated.

In some embodiments, the command manager 111 may generate the environment information EI based on the write temperature information of the temperature bump table 113. The write temperature information of the temperature bump table 113 may be previous information about a temperature sensed by the temperature sensor 121c while the data DT are stored in the memory cell array 124 (i.e., during the write operation).

In a second operation ②, the control logic 121 may perform the on-chip read operation for generating the distribution information DI. For example, the control logic 121 may perform the on-chip read operation based on the target read voltage level and the environment information EI included in the request of the first operation ①. The distribution information generator 121a may generate the distribution information DI while data DT of the memory cell array 124 are read by the on-chip read operation. The distribution information DI may indicate the degradation level of the data DT of the memory cell array 124. The distribution information DI may accurately indicate the degradation level of the data DT of the memory cell array 124 as the environment information EI of the first operation ① is applied.

In some embodiments, the control logic 121 may determine the target read voltage level based on the offset information OI. For example, when the environment information EI does not include the offset information OI, the control logic 121 may perform the on-chip read operation based on the default read voltage level as the target read voltage level. As another example, when the environment information EI includes the offset information OI, the control logic 121 may perform the on-chip read operation based on the read voltage level, which is optimized based on the offset information OI, as the target read voltage level.

In a third operation ③, the control logic 121 may determine whether the read reclaim is required based on the distribution information DI and the environment information EI. The control logic 121 may provide the determination result DR to the I/O circuit 127.

In some embodiments, the reclaim determiner 121b may determine whether the read reclaim is required based on the distribution information DI and the offset information OI. For example, when the environment information EI does not include the offset information OI, the reclaim determiner 121b may determine whether the read reclaim is required based on the distribution information DI and parameter values of the E-fuse circuit 121d, which correspond to the default read voltage level. As another example, when the environment information EI includes the offset information OI, the reclaim determiner 121b may determine whether the read reclaim is required based on the distribution information DI and parameter values of the E-fuse circuit 121d, which correspond to the optimized read voltage level.

In some embodiments, the reclaim determiner 121b may determine whether the read reclaim is required based on the distribution information DI and the temperature information TI. For example, when the environment information EI does not include the write temperature information of the temperature bump table 113, the reclaim determiner 121b may determine whether the read reclaim is required based on the distribution information DI and parameter values of the E-fuse circuit 121d, which correspond to the default temperature condition. As another example, when the environment information EI includes the write temperature information of the temperature bump table 113, the reclaim determiner 121b may fetch temperature parameter values corresponding to a temperature condition from the E-fuse circuit 121d based on the read temperature information received from the temperature sensor 121c during the processing of the read reclaim determination and the write temperature information of the temperature bump table 113. The reclaim determiner 121b may determine whether the read reclaim is required based on the parameter values and the distribution information DI.

In a fourth operation ④, the non-volatile memory device 120 may provide the determination result DR to the storage controller 110. For example, the I/O circuit 127 may provide the command manager 111 with the determination result DR received from the control logic 121.

In a fifth operation ⑤, the command manager 111 may generate the request indicating the read reclaim operation based on the determination result DR. For example, when the determination result DR has the first bit value, the command manager 111 may generate the command indicating the read reclaim operation. As another example, when the determination result DR has the second bit value, the command manager 111 may generate the command indicating the read operation or the read reclaim determination.

FIG. 15 is a diagram illustrating a method of determining read reclaim, according to some embodiments of the present disclosure. A method of determining whether the read reclaim is required based on the offset information OI and temperature information will be described with reference to FIGS. 14 and 15.

The distribution information DI may include a first count value "x" and a second count value "y." The first count value "x" may be a low area count value among the OVS count value corresponding to the target read voltage level. The second count value "y" may be a high area count value among the OVS count value corresponding to the target read voltage level. The E-fuse circuit 121d may store parameter values "A," "B," "C," and "D" and temperature parameter values At, Bt, Ct, and Dt.

The control logic 121 may classify the read reclaim determination as one of a first case, a second case, a third case, and a fourth case, based on the temperature information and the offset information OI of the environment information EI.

In the first case, the environment information EI may not include the offset information OI and may not include the write temperature information. The control logic 121 may generate the distribution information DI based on the default read voltage level of the default read condition, without considering the write temperature information and the read temperature information.

When a sum of the first count value "x" and the second count value "y" exceeds the parameter value "A," when the first count value "x" exceeds the parameter value "B," or when the second count value "y" exceeds the parameter value "B," the reclaim determiner 121b may determine that the read reclaim is required with regard to the data DT of the memory cell array 124. In the remaining conditions of the first case, the reclaim determiner 121b may determine that the read reclaim is not required.

In the second case, the environment information EI may include the offset information OI and may not include the write temperature information. The control logic 121 may generate the distribution information DI based on the optimized read voltage level of the history read condition, without considering the write temperature information and the read temperature information.

When a sum of the first count value "x" and the second count value "y" exceeds the parameter value "C," when the first count value "x" exceeds the parameter value "D," or when the second count value "y" exceeds the parameter value "D," the reclaim determiner 121b may determine that the read reclaim is required with regard to the data DT of the memory cell array 124. In the remaining conditions of the second case, the reclaim determiner 121b may determine that the read reclaim is not required.

In the third case, the environment information EI may not include the offset information OI and may include the write temperature information. The control logic 121 may generate the distribution information DI based on the default read voltage level of the default read condition, with the write temperature information and the read temperature information considered.

When a sum of the first count value "x" and the second count value "y" exceeds the temperature parameter value At, when the first count value "x" exceeds the temperature parameter value Bt, or when the second count value "y" exceeds the temperature parameter value Bt, the reclaim determiner 121b may determine that the read reclaim is required with regard to the data DT of the memory cell array 124. In the remaining conditions of the third case, the reclaim determiner 121b may determine that the read reclaim is not required. In this case, the temperature parameter values At and Bt may be selected from the E-fuse circuit 121d in consideration of both the write temperature information and the read temperature information.

In the fourth case, the environment information EI may include the offset information OI and may include the write temperature information. The control logic 121 may generate the distribution information DI based on the optimized read voltage level of the history read condition, with the write temperature information and the read temperature information considered.

When a sum of the first count value "x" and the second count value "y" exceeds the temperature parameter value Ct, when the first count value "x" exceeds the temperature parameter value Dt, or when the second count value "y" exceeds the temperature parameter value Dt, the reclaim determiner 121b may determine that the read reclaim is required with regard to the data DT of the memory cell array 124. In the remaining conditions of the fourth case, the reclaim determiner 121b may determine that the read reclaim is not required. In this case, the temperature parameter values Ct and Dt may be selected from the E-fuse circuit 121d in consideration of both the write temperature information and the read temperature information.

FIG. 16 is a flowchart illustrating a method of operating a non-volatile memory device according to some embodiments of the present disclosure. A method of operating a non-volatile memory device according to some embodiments of the present disclosure will be described with reference to FIG. 16. The non-volatile memory device may communicate with a storage controller. The non-volatile memory device may correspond to the non-volatile memory device 120 of FIGS. 1, 3, 12, 13, and 14.

In operation S210, the non-volatile memory device may receive the request indicating the read reclaim determination from the storage controller. The request indicating the read reclaim determination may include environment information.

In operation S220, the non-volatile memory device may perform the on-chip read operation for generating the distribution information.

In operation S230, the non-volatile memory device may determine whether the read reclaim is required. When the non-volatile memory device determines, in operation S230, that the read reclaim is required, the non-volatile memory device may perform operation S240.

In operation S240, the non-volatile memory device may provide the storage controller with the determination result having the first bit value.

In operation S241, the non-volatile memory device may receive the request indicating the read reclaim operation from the storage controller. The non-volatile memory device may perform the read reclaim operation.

In some embodiments, the non-volatile memory device may support the on-chip operation of the read reclaim determination. For example, during a period from a time when the non-volatile memory device provides the determination result having the first bit value to a time when the non-volatile memory device receives the request indicating the read reclaim operation, the non-volatile memory device may not provide the storage controller with the target data or the distribution information corresponding to the on-chip read operation.

Returning to operation S230, when the non-volatile memory device determines that the read reclaim is not required, the non-volatile memory device may perform operation S250.

In operation S250, the non-volatile memory device may provide the storage controller with the determination result having the second bit value.

In operation S251, the non-volatile memory device may receive the request indicating the read operation or the read reclaim determination from the storage controller. The non-volatile memory device 120 may perform the read operation or may again determine whether the read reclaim is required.

Figure 17:
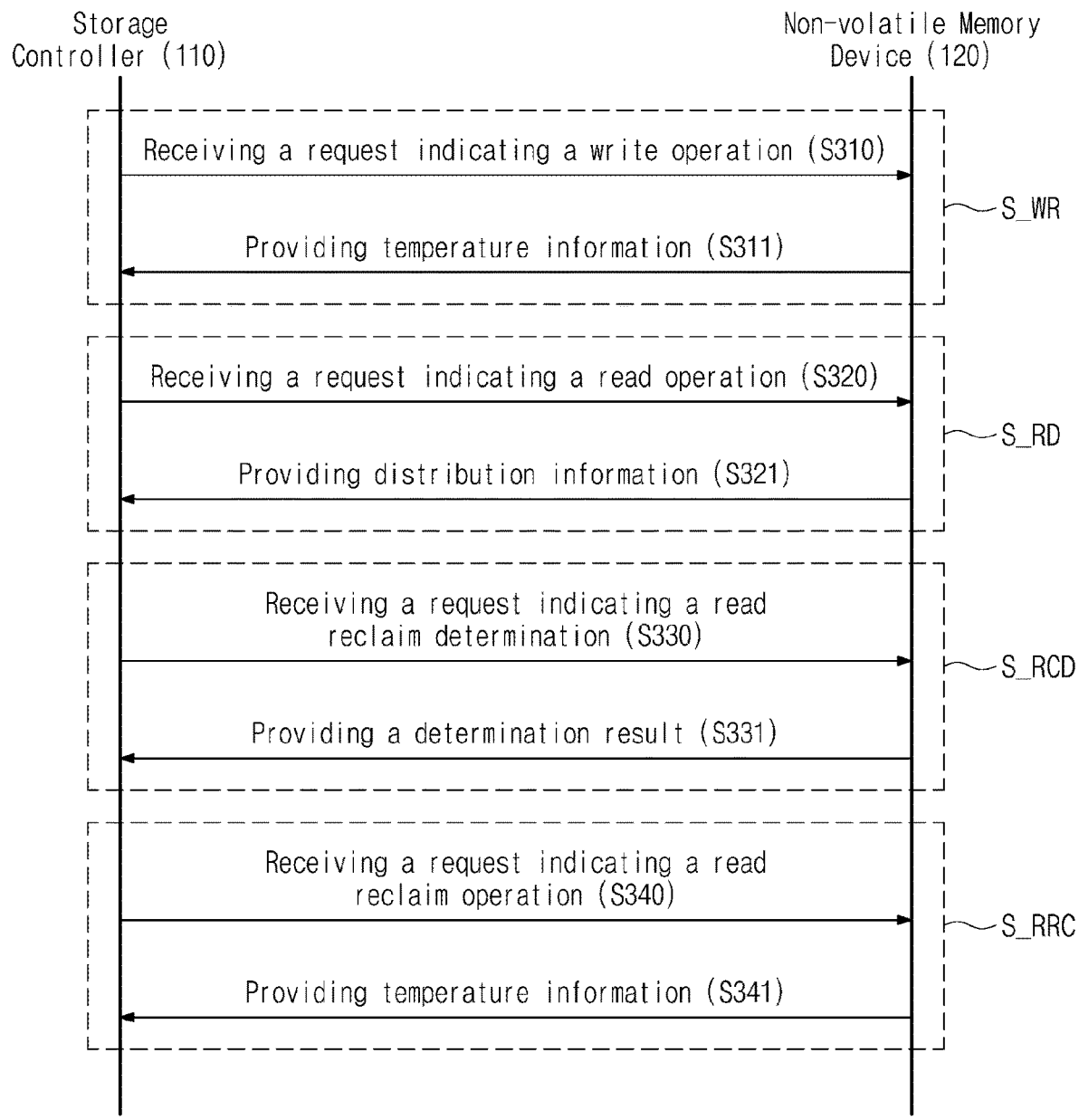
FIG. 17 is a flowchart illustrating a method of operating a storage device, according to some embodiments of the present disclosure.

FIG. 17 is a flowchart illustrating a method of operating a storage device according to some embodiments of the present disclosure. A method of operating a storage device according to some embodiments of the present disclosure will be described with reference to FIG. 17. The storage device may include the storage controller 110 and the non-volatile memory device 120. The storage device may correspond to the storage device 100 of FIGS. 1, 12, 13, and 14.

The storage device may perform a write operation S_WR, a read operation S_RD, a reclaim determination operation S_RCD, and a read reclaim operation S_RRC. The write operation S_WR may include operation S310 and operation S311. The read operation S_RD may include operation S320 and operation S321. The reclaim determination operation S_RCD may include operation S330 and operation S331. The read reclaim operation S_RRC may include operation S340 and operation S341.

In operation S310, the non-volatile memory device 120 may receive the request indicating the write operation from the storage controller 110. The non-volatile memory device 120 may perform the write operation. For example, the non-volatile memory device 120 may store target data corresponding to the write operation and may generate temperature information based on a temperature sensed during the write operation.

In operation S311, the non-volatile memory device 120 may provide the temperature information to the storage controller 110. A temperature bump table of the storage controller 110 may store the temperature information as the write temperature information.

In operation S320, the non-volatile memory device 120 may receive the request indicating the read operation from the storage controller 110. The non-volatile memory device 120 may perform the read operation. For example, the non-volatile memory device 120 may generate the read data and the distribution information corresponding to the target data by performing the on-chip read operation. In some embodiments, the read operation may be the normal read operation that is based on the request of the host. For example, the read operation in operation S320 may not be the dummy read operation.

In operation S321, the non-volatile memory device 120 may provide the distribution information to the storage controller 110. The storage controller 110 may generate the offset information based on the distribution information. A history table of the storage controller 110 may store the offset information.

In operation S330, the non-volatile memory device 120 may receive the request indicating the read reclaim determination from the storage controller 110. The request indicating the read reclaim determination may include environment information. The environment information may include the write temperature information and the offset information. The non-volatile memory device 120 may perform the on-chip read operation to generate the distribution information. The non-volatile memory device 120 may determine whether the read reclaim is required based on the distribution information and the environment information.

In operation S331, the non-volatile memory device 120 may provide a determination result to the storage controller 110. For example, in operation S330, the non-volatile memory device 120 may determine that the read reclaim is required, and the determination result may have the first bit value.

In operation S340, the non-volatile memory device 120 may receive the request indicating the read reclaim operation from the storage controller 110. For example, in response to the determination result having the first bit value, the storage controller 110 may provide the non-volatile memory device 120 with the request indicating the read reclaim operation. The non-volatile memory device 120 may perform the read reclaim operation. The read reclaim operation may include operations of reading data from a degraded memory region, writing the read data in a new memory region, and erasing the degraded memory region. The non-volatile memory device 120 may generate temperature information based on a temperature sensed while the write operation is performed on the new memory region.

In operation S341, the non-volatile memory device 120 may provide the temperature information to the storage controller 110. The temperature bump table of the storage controller 110 may store the temperature information as the write temperature information.

Unlike the example of FIG. 17, when the non-volatile memory device 120 determines, in operation S330, that the read reclaim is not required, in operation S331, the non-volatile memory device 120 may provide the storage controller 110 with the determination result having the second bit value. In this case, after operation S331, the storage device may perform the read operation S_RD or the reclaim determination operation S_RCD, instead of the read reclaim operation S_RRC.

According to an embodiment of the present disclosure, a non-volatile memory device for determining read reclaim, a method of operating, and a method of operating a storage device including the same may be provided.

Also, because the non-volatile memory device determines the read reclaim, a non-volatile memory device that reduces the latency and the I/O load between the storage controller and the non-volatile memory device and accurately determines the read reclaim depending on a temperature condition and a voltage level optimized based on environment information, a method of operating, and a method of operating a storage device including the same may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating a non-volatile memory device, which communicates with a storage controller, the method comprising:
    receiving from the storage controller a first request indicating a read reclaim determination and including environment information selected from a group consisting of: (i) offset information indicating a difference between an optimized valley and a default valley, (ii) write temperature information when target data corresponding to the first on-chip read operation are stored in the non-volatile memory device, (iii) a number of program/erase (P/E) cycles of the non-volatile memory device, (iv) a count value of a read operation for the target data, (v) maximum error correcting code (ECC) information of the storage controller, and (vi) word line information indicating whether coupled word lines exist;
    performing a first on-chip read operation for generating first distribution information based on the first request by determining whether the first request includes the offset information, and then: performing the first on-chip read operation based on a default read voltage level when the first request does not include the offset information, or performing the first on-chip read operation based on a read voltage level optimized based on the offset information when the first request includes the offset information;
    determining whether a read reclaim is required based on the first distribution information; and
    providing the storage controller with a determination result having a first bit value in response to determining that the read reclaim is required.

2. The method of claim 1, further comprising:
    after providing the determination result having the first bit value, receiving a second request indicating a read reclaim operation from the storage controller; and
    performing the read reclaim operation based on the second request.

3. The method of claim 2, wherein the non-volatile memory device does not provide the storage controller with target data or the first distribution information corresponding to the first on-chip read operation during a period from a first time when the non-volatile memory device provides the determination result having the first bit value to a second time when the non-volatile memory device receives the second request indicating the read reclaim operation.

4. The method of claim 1, wherein the environment information includes the write temperature information,
    wherein the performing of the first on-chip read operation for generating the first distribution information based on the first request includes:
    generating, using a temperature sensor of the non-volatile memory device, read temperature information based on the first request,
    wherein the determining whether the read reclaim is required based on the first distribution information includes:
    determining whether the read reclaim is required, based on the first distribution information, the write temperature information, and the read temperature information.

5. The method of claim 1, wherein the first on-chip read operation includes an on-chip valley search (OVS) read operation based on a target read voltage level,
    wherein the first distribution information includes:
    a first count value indicating the number of memory cells whose threshold voltages are between the target read voltage level and a first reference voltage level lower than the target read voltage level as much as a reference voltage amount; and
    a second count value indicating the number of memory cells whose threshold voltages are between the target read voltage level and a second reference voltage level higher than the target read voltage level as much as the reference voltage amount.

6. The method of claim 5, wherein the first count value and/or the second count value has a non-linear correspondence relationship with regard to an error count value corresponding to the target read voltage level.

7. The method of claim 5, wherein the first count value and/or the second count value has a linear correspondence relationship with regard to an error count value corresponding to the target read voltage level.

8. The method of claim 5, wherein the determining whether the read reclaim is required based on the first distribution information includes:
    when the environment information does not include offset information and does not include write temperature information, determining whether the read reclaim is required based on the first distribution information, a first parameter value, and a second parameter value;
    when the environment information includes the offset information and does not include the write temperature information, determining whether the read reclaim is required based on the first distribution information, a third parameter value, and a fourth parameter value;
    when the environment information does not include the offset information and includes the write temperature information, determining whether the read reclaim is required based on the first distribution information, a fifth parameter value, and a sixth parameter value; and
    when the environment information includes the offset information and includes the write temperature information, determining whether the read reclaim is required based on the first distribution information, a seventh parameter value, and an eighth parameter value.

9. The method of claim 8, wherein the determining whether the read reclaim is required based on the first distribution information, the first parameter value, and the second parameter value, when the environment information of the first request does not include the offset information and does not include the write temperature information includes:
    determining that the read reclaim is required when a sum of the first count value and the second count value exceeds the first parameter value, when the first count value exceeds the second parameter value, or when the second count value exceeds the second parameter value.

10. The method of claim 8, wherein an E-fuse circuit of the non-volatile memory device stores the first to eighth parameter values.

11. The method of claim 1, further comprising:
    providing the storage controller with the determination result having a second bit value different from the first bit value, in response to determining that the read reclaim is not required; and receiving a third request indicating a read operation or the read reclaim determination from the storage controller.

12. The method of claim 1, further comprising:
before receiving the first request, receiving a fourth request indicating a write operation for target data corresponding to the first on-chip read operation from the storage controller;
performing the write operation based on the fourth request;
while performing the write operation, generating, using a temperature sensor of the non-volatile memory device, write temperature information; and
providing the write temperature information to the storage controller.

13. The method of claim 1, further comprising:
before receiving the first request, receiving a fifth request indicating a read operation for target data corresponding to the first on-chip read operation from the storage controller;
performing a second on-chip read operation for generating second distribution information based on the fifth request; and
providing the second distribution information to the storage controller.

14. A non-volatile memory device comprising:
a memory cell array configured to store target data; and
control logic configured to manage the target data based on communication with a storage controller,
wherein the control logic is configured to:
receive a request indicating a read reclaim determination and including environment information from the storage controller;
perform an on-chip read operation of the target data for generating distribution information based on the request;
determine whether a read reclaim for the target data is required based on the distribution information;
provide the storage controller with a determination result having a first bit value in response to determining that the read reclaim is required; and
provide the storage controller with the determination result having a second bit value, different from the first bit value, in response to determining that the read reclaim is not required;
wherein the control logic includes:
a distribution information generator configured to generate the distribution information based on the on-chip read operation for the target data;
a reclaim determiner configured to determine whether the read reclaim for the target data is required based on the distribution information;
a temperature sensor configured to generate temperature information when the on-chip read operation or a write operation is performed; and
an E-fuse circuit configured to store the distribution information and to store a plurality of parameter values used to determine whether the read reclaim for the target data is required;
wherein the plurality of parameter values include a first parameter value, a second parameter value, a third parameter value, a fourth parameter value, a fifth parameter value, a sixth parameter value, a seventh parameter value, and an eighth parameter value; and wherein the reclaim determiner is further configured to:
when the environment information does not include offset information and does not include write temperature information, determine whether the read reclaim is required based on the distribution information, the first parameter value, and the second parameter value;
when the environment information includes the offset information and does not include the write temperature information, determine whether the read reclaim is required based on the distribution information, the third parameter value, and the fourth parameter value;
when the environment information does not include the offset information and includes the write temperature information, determine whether the read reclaim is required based on the distribution information, the fifth parameter value, and the sixth parameter value; and
when the environment information includes the offset information and includes the write temperature information, determine whether the read reclaim is required based on the distribution information, the seventh parameter value, and the eighth parameter value.

15. A method of operating a non-volatile memory device, comprising:
receiving a first request, which indicates a read reclaim determination and includes offset information indicating a difference between an optimized valley and a default valley;
performing a first on-chip read operation for generating first distribution information based on the first request by determining whether the first request includes the offset information, and then:
performing the first on-chip read operation based on a default read voltage level when the first request does not include the offset information, or
performing the first on-chip read operation based on a read voltage level optimized based on the offset information when the first request includes the offset information;
determining whether a read reclaim is required based on the first distribution information; and
providing a storage controller with a determination result having a first bit value in response to determining that the read reclaim is required.

16. The method of claim 15, further comprising:
providing the storage controller with the determination result having a second bit value different from the first bit value, in response to determining that the read reclaim is not required.

17. The method of claim 15, further comprising:
before receiving the first request, receiving a request indicating a read operation for target data corresponding to the first on-chip read operation, and then performing a second on-chip read operation for generating second distribution information; and
providing the second distribution information to the storage controller.

* * * * *